(12) United States Patent
Schowalter et al.

(10) Patent No.: US 7,776,153 B2
(45) Date of Patent: Aug. 17, 2010

(54) METHOD AND APPARATUS FOR PRODUCING LARGE, SINGLE-CRYSTALS OF ALUMINUM NITRIDE

(75) Inventors: Leo J. Schowalter, Latham, NY (US); Glen A. Slack, Scotia, NY (US); J. Carlos Rojo, East Setauket, NY (US)

(73) Assignee: Crystal IS, Inc., Green Island, NY (US)

( * ) Notice: Subject to any disclaimer, the term of this patent is extended or adjusted under 35 U.S.C. 154(b) by 635 days.

(21) Appl. No.: 11/265,909

(22) Filed: Nov. 3, 2005

(65) Prior Publication Data
US 2008/0006200 A1    Jan. 10, 2008

Related U.S. Application Data

(63) Continuation of application No. 10/910,162, filed on Aug. 3, 2004, now abandoned, which is a continuation-in-part of application No. 10/324,998, filed on Dec. 20, 2002, now Pat. No. 6,770,135.

(60) Provisional application No. 60/344,672, filed on Dec. 24, 2001.

(51) Int. Cl.
C30B 21/02    (2006.01)

(52) U.S. Cl. .............. 117/81; 117/82; 117/83; 117/104; 117/106

(58) Field of Classification Search .......... 117/81, 117/82, 83, 104, 106
See application file for complete search history.

(56) References Cited

U.S. PATENT DOCUMENTS
3,531,245 A    9/1970    Dietz
(Continued)

FOREIGN PATENT DOCUMENTS
DE    102 48 964 A1    4/2004
(Continued)

OTHER PUBLICATIONS

A. Chitnis, et al., "Milliwatt power AlGaN quantum well deep ultraviolet light emitting diodes," Phys. Stat. Sol. (a) 200, 88 (2003).
(Continued)

*Primary Examiner*—Robert M Kunemund
(74) *Attorney, Agent, or Firm*—Goodwin Procter LLP

(57) ABSTRACT

A method and apparatus for producing bulk single crystals of AlN having low dislocation densities of about 10,000 cm$^{-2}$ or less includes a crystal growth enclosure with Al and $N_2$ source material therein, capable of forming bulk crystals. The apparatus maintains the $N_2$ partial pressure at greater than stoichiometric pressure relative to the Al within the crystal growth enclosure, while maintaining the total vapor pressure in the crystal growth enclosure at super-atmospheric pressure. At least one nucleation site is provided in the crystal growth enclosure, and provision is made for cooling the nucleation site relative to other locations in the crystal growth enclosure. The Al and $N_2$ vapor is then deposited to grow single crystalline low dislocation density AlN at the nucleation site. High efficiency ultraviolet light emitting diodes and ultraviolet laser diodes are fabricated on low defect density AlN substrates, which are cut from the low dislocation density AlN crystals. Bulk crystals of ZnO may also be produced using the method.

6 Claims, 6 Drawing Sheets

U.S. PATENT DOCUMENTS

| | | | |
|---|---|---|---|
| 3,600,701 A | 8/1971 | Gouldthorpe | |
| 3,603,414 A | 9/1971 | Stebley | |
| 3,607,014 A | 9/1971 | Huml et al. | |
| 3,634,149 A | 1/1972 | Knippenberg et al. | |
| 3,768,983 A | 10/1973 | Elkins et al. | |
| 3,903,357 A | 9/1975 | Woolfson et al. | |
| 3,933,573 A | 1/1976 | Dugger | |
| 4,008,851 A | 2/1977 | Hirsch | |
| 4,088,515 A | 5/1978 | Blakeslee et al. | |
| 4,234,554 A | 11/1980 | Rabenau et al. | |
| 4,547,471 A | 10/1985 | Huseby et al. | |
| 5,494,861 A | 2/1996 | Yamaga et al. | |
| 5,520,785 A | 5/1996 | Evans et al. | |
| 5,858,085 A | 1/1999 | Arai et al. | |
| 5,858,086 A | 1/1999 | Hunter | |
| 5,868,837 A | 2/1999 | DiSalvo et al. | |
| 5,909,036 A | 6/1999 | Tanaka et al. | |
| 5,924,874 A | 7/1999 | Gotoh et al. | |
| 5,972,109 A | 10/1999 | Hunter | |
| 6,000,174 A | 12/1999 | Yamazaki et al. | |
| 6,001,748 A | 12/1999 | Tanaka et al. | |
| 6,006,620 A | 12/1999 | Lawrie et al. | |
| 6,045,612 A | 4/2000 | Hunter | |
| 6,048,813 A | 4/2000 | Hunter | |
| 6,063,185 A | 5/2000 | Hunter | |
| 6,066,205 A | 5/2000 | Hunter | |
| 6,086,672 A | 7/2000 | Hunter | |
| 6,187,089 B1 | 2/2001 | Phillips et al. | |
| 6,270,569 B1 | 8/2001 | Shibata et al. | |
| 6,296,956 B1 | 10/2001 | Hunter | |
| 6,398,867 B1 | 6/2002 | D'Evelyn et al. | |
| 6,404,125 B1 | 6/2002 | Garbuzov et al. | |
| 6,447,604 B1 | 9/2002 | Flynn et al. | |
| 6,468,347 B1 | 10/2002 | Motoki et al. | |
| 6,592,663 B1 | 7/2003 | Sarayama et al. | |
| 6,719,843 B2 | 4/2004 | Schowalter et al. | |
| 6,770,135 B2 * | 8/2004 | Schowalter et al. | 117/106 |
| 6,936,357 B2 | 8/2005 | Melnik et al. | |
| 7,037,838 B2 | 5/2006 | Schowalter et al. | |
| 7,056,383 B2 | 6/2006 | Helava et al. | |
| 7,063,741 B2 | 6/2006 | D'Evelyn et al. | |
| 7,211,146 B2 | 5/2007 | Schowalter et al. | |
| 7,288,152 B2 | 10/2007 | Kitaoka et al. | |
| 2002/0170490 A1 | 11/2002 | Vodakov et al. | |
| 2003/0168003 A1 | 9/2003 | Schowalter et al. | |
| 2003/0216011 A1 | 11/2003 | Nakamura et al. | |
| 2004/0033690 A1 | 2/2004 | Schowalter et al. | |
| 2004/0187766 A1 | 9/2004 | Letertre | |
| 2004/0206978 A1 | 10/2004 | Saxler | |
| 2004/0213309 A9 | 10/2004 | Amano et al. | |
| 2004/0224484 A1 | 11/2004 | Fareed et al. | |
| 2004/0245535 A1 | 12/2004 | D'Evelyn et al. | |
| 2005/0072986 A1 | 4/2005 | Sasaoka | |
| 2005/0103257 A1 | 5/2005 | Xu et al. | |
| 2005/0142391 A1 | 6/2005 | Dmitriev et al. | |
| 2005/0161697 A1 | 7/2005 | Nakahata et al. | |
| 2005/0214992 A1 | 9/2005 | Chakraborty et al. | |
| 2005/0285141 A1 | 12/2005 | Piner et al. | |
| 2006/0244011 A1 | 11/2006 | Saxler | |
| 2006/0288929 A1 | 12/2006 | Slack et al. | |
| 2007/0101932 A1 | 5/2007 | Schowalter et al. | |
| 2007/0131160 A1 | 6/2007 | Slack et al. | |

FOREIGN PATENT DOCUMENTS

| | | |
|---|---|---|
| EP | 0 609 799 A2 | 8/1994 |
| EP | 0811708 | 12/1997 |
| EP | 0979883 | 2/2000 |
| EP | 1211715 | 6/2002 |
| EP | 1 732 145 A2 | 12/2006 |
| EP | 1 754 810 A1 | 2/2007 |
| JP | 61-236686 | 10/1986 |
| JP | 61236686 | 10/1986 |
| JP | 02-018379 A | 1/1990 |
| JP | 03-285075 | 12/1991 |
| JP | 2000-154090 | 6/2000 |
| WO | WO 00/22203 | 4/2000 |
| WO | WO-0022203 | 4/2000 |
| WO | WO-03-007383 | 1/2003 |
| WO | WO-03-081730 A2 | 10/2003 |
| WO | WO-2005-012602 A1 | 2/2005 |
| WO | WO-2006-110512 A1 | 10/2006 |
| WO | WO-2007-062250 A2 | 5/2007 |
| WO | WO-2008-042020 A2 | 4/2008 |

OTHER PUBLICATIONS

A. Khan, "AlGaN based deep ultraviolet light emitting diodes with emission from 250-280 nm," abstract and presentation at the International Workshop on Nitride Semiconductors in Pittsburg, PA (Jul. 19, 2004).

A.S. Bolgar, S.P. Gordienko, E.A. Ryklis, and V.V. Fesenko, in "Khim. Fiz. Nitridov", p. 151-6 (1968) [Chem. Abstr. 71, 34003j (1969)].

A.S. Segal, S. Yu, Karpov, Yu.N. Makarov, E.N. Mokhov, A.D. Roenkov, M.G. Ramm, Yu.A. Vodakov, "On mechanisms of sublimation growth of AlN bulk crystals," J. Crystal Growth 211, 68 (2000).

B. Raghothamachar, W. M. Vetter, M. Dudley, R. Dalmau, R. Schlesser, Z. Sitar, E. Michaels, J. W. Kolis; "Synchotron white beam topography characterization of physical vapor transport grown AlN and ammonothermal GaN", J. Cryst. Growth, 246, 271, (2002).

C.M. Balkas, Z. Sitar, T. Zheleva, L. Bergman, R. Nemanich, R. F. Davis, "Sublimation growth and characterization of bulk aluminum nitride single crystals", J. Crystal Growth 179, (1997) 363.

Dryburgh, "Estimation of maximum growth rate for aluminum nitride crystals by direct sublimation," J. Crystal Growth 125, 65 (1992).

G.A. Slack and T. McNelly, "AlN Single Crystals", J. Cryst. Growth 42, (1977) 560-563.

G.A. Slack and T. McNelly, "Growth of High Purity Ain Crystals", J. Cryst. Growth 34, (1976) 263-279.

Hack et al. "Photoluminescence Intensity and Spectral Distribution of GaN Films on SiC" (1999) Phy. Stat. Sol. (b) 216:639.

J. A. Smart, A. T. Schremer, N. G. Weimann, O. Ambacher, L. F. Eastman, and J. R. Shealy, "AlGaN/GaN heterostructures on insulating AlGaN nucleation layers"; Appl. Phys. Lett. 75, 388 (1999).

J. C. Rojo, G. A. Slack, K. Morgan, B. Raghothamachar, M. Dudley and L. J. Schowalter; "Report on the growth of bulk aluminum nitride and subsequent substrate preparation"; J. Cryst. Growth 231, 317 (2001).

J. C. Rojo, L.J. Schowalter R. Gaska, M. Shur, M.A. Khan, Y Yang, and D.D. Koleske; "Growth and characterization of epitaxial layers on Aluminum Nitride substrates prepared from bulk, single crystals". Journal of Crystal Growth 240 (2002) 508.

J. Phys. Chem. Ref. Data 14, Supplement No. 1 (1985).

J.W. Matthews and A.E. Blakeslee, "Defects in epitaxial multilayers," J. Crystal Growth 27, 118 (1974).

J.Y. Tsao, Circuits and Devices Magazine, IEEE 20, 28 (2004).

L. J. Schowalter, G. A. Slack, J. B. Whitlock, K. Morgan, S. B. Schujman, B. Raghothamachar, M. Dudley and K. R. Evans, "Fabrication of Native, Single-Crystal AlN Substrates," phys. stat. sol., 0, 1997 (2003).

L. Liu and J.H. Edgar, "A global growth rate model for aluminum nitride sublimation," J. Electrochemical Soc. 149, G12 (2002).

L. Liu, D Zhuang, B. Liu, Y. Shi, J. H. Edgar, S. Rajasingam, M. Kuball; "Characterization of AlN crystals grown by sublimation". Physica Status Solidi A 188 (2001) 769.

M. Takeya, et al., "Degradation in AlGaInN lasers," Phys. Stat. Sol. (c) 0, 2292 (2003).

N.B. Singh, A. Berghmans, H. Zhang, T. Wait, R.C. Clarke, J. Zingaro, and J.C. Golombeck, "Physical vapor transport growth of large AlN crystals," J. Cryst. Growth, 250, 107 (2003).

Nassau et al. "The Physics and Chemistry of Color" (1983) Wiley-Interscience Publication, New York.

R. Schlesser, R. Dalmau, R. Yakimova and Z. Sitar; "Growth of AlN bulk crystals from the vapor phase", Mat. Res. Symp. Proc. 693,I9.4.1 (2002).

R. Schlesser, R. Dalmau, Z. Sitar; "Seeded growth of AlN bulk single crystals by sublimation". Journal of Crystal Growth 241 (2002) 416.

Raghothamacher et al. "X-Ray Characterization of Bulk AlN Single Crystals Grown by the Sublimation Technique", (2003) J. Crystal Growth 250:244-250.

Rojo et al. "Progress in the Preparation of Aluminum Nitride Substrates from Bulk Crystals", Mat. Res. Soc. Symp. Proc. vol. 722 (2002) pp. K1.1.1-K1.1.9.

S. Tomiya, et al., "Dislocations in GaN-based laser diodes on epitaxial lateral overgrown GaN layers," Phys. Stat. Sol. (a) 188, 69 (2001).

S.Yu. Karpov, D.V. Zimina, Yu.N. Makarov, E.N. Mokhov, A.D. Roenkov, M.G. Ramm, and Yu.A. Vokakov, "Sublimation growth of AlN in vacuum and in a gas atmosphere," Phys. Stat. Sol. (a) 176, 435 (1999).

Schowalter et al. "Fabrication of Native, Single-Crystal AlN Substrates", Phys. Stat. Sol. (2004) (c):1-4.

S. Tomiya et al. "Dislocations in GaN-Based Laser Diodes on Epitaxial Lateral Overgrown GaN Layers", (2001) Phys. Stat. Sol. (a) 188(1):69-72.

Tsao "Solid-State Lighting: Lamps, Chips and Materials for Tomorrow" (2004) Circuits and Devices Magazine, IEEE 20:28.

Dryburgh, "Estimation of maximum growth rate for aluminum nitride crystals by direct sublimation", *J. Crystal Growth* 125, 65-68 (1992).

J. Phys. Chem. Ref. data 14, Supplement No. 1 (1985).

A.S. Bolgar, S.P. Gordienko, E.A. Ryklis, and V.V. Fesenko, in "Khim. Fiz. Nitridov", p. 151-156 (1968) [Chem. Abstr. 71, 34003j (1969)].

A.S. Segal S. Yu, Karpov, Yu. N. Makarov, E.N. Mokhov, A.D. Roenkov, M.G. Ramm, Yu. A. Vodakov, "On mechanisms of sublimination growth of AlN bulk crystals", *J. Crystal Growth* 211, 68-72 (2000).

G.A. Slack and T.McNelly, "Growth of High Purity AlN Crystals", *J. Crystal Growth* 34, 263-279 (1976).

G.A. Slack and T.McNelly, "AlN Single Crystals", *J. Crystal Growth* 42, 570-563 (1977).

B. Raghothamacher, M. Dudley, J.C. Rojo, K. Morgan, and L.J. Schowalter, "X-ray charaxterization of bulk AlN single crystals grown by the sublimation technique", *J. Crystal Growth* 250, 244-250 (2003).

L.J. Schowalter, G.A. Slack, J.B. Whitlock, K. Morgan, S.B. Schujman, B. Raghothamachar, M. Dudley, and K.R. Evans, "Fabrication of native, single-crystal AlN substrates", *Phys. Stat. Sol.* (c), 104, (2003).

A. Chitnis, V. Adivaraham, J.P. Zhang, M. Shatalov, S. Wu, J. Yang, G. Simin, M. Asif Khan, X. Hu, Q. Fareed, R. Gaska, and M.S. Shur, "Milliwatt power AlGaN quantum well deep ultraviolet light emitting diodes", *Phys. Stat. Sol.* (a) 200, No. 1, 99-101 (2003).

M. Takeya, T. Mizuno, T. Sasaki, S. Ikeda, T. Fujumoto, Y. Ohfuji, K. Oikawa, Y. Yabuki, S. Uchida, and M. Ikeda, "Degredation in AlGaInN lasers", *Phys. Stat. Sol.* (c) 0, No. 7, 2292-2295 (2003).

S. Tomiya, H. Nakajima, K. Funato, T. Miyajima, K. Kobayashi, T. Hino, S. Kijima, T. Asano, and M. Ikeda, "Dislocations in GaN-Based Laser Diodes on Epitaxial Lateral Overgrown GaN Layers", *Phys. Stat. Sol.* (a) 188, No. 1, 69-72 (2001).

J. Y. Tsao, "Solid-State Lighting: Lamps, Chips and Materials for Tomorrow", *Circuits and Devices Magazine, IEEE* 20, 28 (2004).

V. Noveski, R. Schlesser, S. Mahajan, S. Beaudoin, and Z. Sitar, "Growth of AlN crystals on AlN/SiC seeds by AlN powder sublimation in nitrogen atmostphere", *MRS Internet J. Nitride Semicond. Res.* 9, 2 (2004).

V. Noveski, R. Schlesser, S. Mahajan, S. Beaudoin, and Z. Sitar, "Mass transfer in AlN crystal growth at high temperatures", *J. Crystal Growth* 264, 369-378 (2004).

B. Raghothamachar, W.M. Vetter, M. Dudley, R. Dalmau, R. Schlesser, Z. Sitar, E. Michaels, and J.W. Kolis, "Synchrotron white beam topography characterization of physical vapor transport grown AlN and ammonothermal GaN", *J. Crystal Growth* 246, 271-280 (2002).

R. Schlesser, R. Dalmau, and Z. Sitar, "Seeded growth of AlN bulk single crystals by sublimation", *J. Crystal Growth* 241, 416-420 (2002).

Arulkumaran et al., "Improved dc characteristics of AlGaN/GaN high-electron-mobility transistors on AlN/sapphire templates", *Applied Physics Letters*, AIP, American Institute of Physics, Melville, NY, US, vol. 81, No. 6 (Aug. 5, 2002), pp. 1131-1133.

Partial International Search Report for PCT/US2007/11075 dated May 7, 2008, 2 pages.

Venugopal et al., "Comparison of Various Buffer Schemes to Grow GaN on Large-Area Si (11) Substrates Using Metal-Organic Chemical-Vapor Deposition", *Jrl of Electronic Materials*, vol. 32, No. 5 (2003) pp. 371-374.

Barin, *Thermochemical Data of Pure Substances, 2nd Ed.*, (1993) pp. 42, 1334-1335, 1337, 1381-1382, 1636-1639.

Bickermann et al., "Characterization of bulk AlN with low oxygen content," *Jrl. of Crys. Growth*, vol. 269, Nos. 2-4, pp. 432-442.

Bockowski et al., "Combustion Synthesis of Aluminum Nitride Under High Pressure of Nitrogen and Nitrogen-Argon Mixtures," *5 J. Mat. Synthesis & Processing 6*, (1997) pp. 449-458.

Chase, *J. Phys. Chem.*, Ref. Data, Monograph No. 9, NIST-JANAF Thermochemical Tables, 4th Ed. (1998).

Constantin et al., "Mixing rocksalt and wurtzite structure binary nitrides to form novel ternary alloys: ScGaN and MnGaN," *Mat. Res. Soc. Symp. Proc.*, 799 (2004) Z9.5.1.

Cox et al., "On the Preparation, Optical Properties and Electrical Behaviour of Aluminum Nitride," *J. Phys. Chem. Solids*, (1967) vol. 28, pp. 543-548.

Dalmau et al., *Mat. Res. Soc. Proc.*, (2004) vol. 798, p. Y2.9.1.

DeVries et al., "Phase equilibria pertinent to the growth of cubic boron nitride," *J. Cryst. Growth*, 13/14 (1972) 88.

Dugger, "The single crystal synthesis and some properties of Aluminum Nitride", Air Force Cambridge Research Laboratories, Physical Science Research Papers, No. 656 (Aug. 1, 1975).

Dugger, The synthesis of Aluminum Nitride single crystals:, *Mat. Res. Bulletin*, 9 (1974) 331.

Epelbaum et al., "Sublimation growth of bulk AlN crystals: materials compatibility and crystal quality," *Mat. Sci. Forum*, (2002) 389-393, 1445.

Gorbatov et al., "Electrical Conductivity of Materials from Mixed Aluminum and Silicon Nitrides," *Sov. Powd. Met. Met. Ceram.*, (1970) vol. 9, pp. 917-920.

Hermann et al., "Highly Si-doped AlN Grown by Plasma-Assisted Molecular-Beam Epitaxy," *Applied Phys. Letters*, (2005) vol. 86, pp. 192108-1-192108-3.

Honig, "Vapor Pressure Data for the Solid and Liquid Elements", *RCA Review*, vol. 23 (1962) 567.

International Preliminary Report on Patentability and Written Opinion for PCT/US2006/022329.

International Preliminary Report on Patentability and Written Opinion for PCT/US2006/045540, mailed Jun. 12, 2008.

International Preliminary Report on Patentability and Written Opinion for PCT/US2006/046300, mailed Jun. 12, 2008.

International Search Report and Written Opinion for PCT/US2007/011075, mailed Jul. 11, 2008.

International Search Report and Written Opinion for PCT/US2007/07980, mailed Oct. 12, 2007.

International Search Report and Written Opinion for PCT/US2008/000597, mailed May 20, 2008.

International Search Report and Written Opinion for PCT/US2008/001003, mailed Aug. 5, 2008.

International Search Report for PCT/US2006/022329, mailed Dec. 12, 2006.

International Search Report for PCT/US2006/045540, mailed Jul. 6, 2007.

International Search Report for PCT/US2006/046300, mailed May 30, 2007.

Jahnen et al., "Pinholes, Dislocations and Strain Relaxation in InGaN," *MRS Internet J. Nitride Semicond. Res.*, (1998) 3:39.

Kanechika et al., "n-type AlN Layer by Si Ion Implantation," *Applied Phys. Letters*, (2006) vol. 88, p. 202106.

Karel et al., "The luminescence properties of AlN with Manganese and rare earth activators under ultraviolet and cathode-ray excitation", *Czech. J. Phys.*, B20 (1970) 46.

Karpinski et al., "Equilibrium pressure of $N_2$ over GaN and high pressure solution growth of GaN", *J. Cryst. Growth*, 66 (1984) 1.

Karpov et al., "Sublimation Growth of AlN in Vacuum and in a Gas Atmosphere," *Phys. Stat. Sol. (a)*, (1999) 176, p. 435.

Kasu et al., "Formation of Solid Solution of Al1-xSixN ($0<x?12\%$) Ternary Alloy," *Jap. J. Appl. Phys.*, (2001) vol. 40, Part 2, No. 10A, pp. L1048-L1050.

Kawabe et al., "Electrical and Optical Properties of AlN-a Thermostable Semiconductor," *Elec. Engin. In Japan*, (1967) vol. 87, pp. 62-70.

Kordis, "The BeO-MgO system", *J. Nuc. Mater.*, 14 (1964) 322.

Lawson et al., "Preparation of Single Crystals", Academic Press, New York (1958) pp. 18-20.

Liu et al., "Misfit Dislocation Generation in InGaN Epilayers on Free-Standing GaN," *Jap. J. Appl. Physics*, (2006) 46:22, pp. L549-L551.

Ludwig et al., "Dimers [$Al_2N_4$]", *Zeitsch. f. Naturforsch.*, B54 (1999) pp. 461-465.

Mokhov et al., "Sublimation growth of AlN bulk crystals in Ta crucibles," *Jrl. Of Crys. Growth*, (Jul. 15, 2005) vol. 281, No. 1, pp. 93-100.

Naidu et al., Eds. "Phase Diagrams of Binary Tungsten Alloys," Indian Institute of Metals, Calcutta, pp. 7-13 (1991).

Nakanishi et al., "Effects of Al Composition on luminescence properties of europim implanted $Al_xGa_{1-x}N$ ($0<x<1$)", *Phys. Stat. Sol. (c)*, 0 (2003) 2623.

Niewa et al., "$Li_3[ScN_2]$: The first nitridoscandate (III)—Tetrahedral Sc Coordination and unusual $MX_2$ framework", *Chem. Eur. J.* 9 (2003) 4255.

Niewa et al., "Recent developments in nitride chemistry", *Chem. Mater.*, 10 (1998) 2733.

Office Action in Japanese Patent Application No. 2003-579324, May 27, 2008 (English Translation).

Parker et al., "Determination of the critical layer thickness in the InGaN/GaN heterostructures," *Applied Phys. Letters.*, (1999) vol. 75, No. 18, pp. 2776-2778.

Proc. of NATO Advanced Study Inst. on Nitrogen Ceramics, University of Kent, Canterbury, U.K. (1976).

Shih et al, "High-quality and crack-free $Al_xGa_{1-x}N$ (x-0.2) grown on sapphire by a two-step growth method," *Jrl. of Crys. Growth*, (Apr. 15, 2005) vol. 277, No. 1-4, pp. 44-50.

Silveira et al., "Excitonic Structure of Bulk AlN from Optical Reflectivity and Cathodoluminescense Measurements," *Phys. Review* B71, 041201® (2006).

Slack et al., "Properties of Crucible Materials for Bulk Growth of AlN," *Mat. Res. Soc. Proc.*, (2004) vol. 798, pp. Y10.74.1-Y10.74.4.

Slack et al., "Some Effects of Oxygen Impurities on AlN and GaN," *J. Crystal Growth*, (2002) 246, pp. 287-298.

Solid State Lighting Report (Dept. Of Energy, 2007).

Song, "Strain relaxation due to V-pit formation in InxGa1-xN/GaN epilayers grown on sapphire," *J. Applied Phys.*, (2005) 98: 084906.

Sun et al., "Phase relationships in the system Y-Al-O-N", *Mater. Letters*, 3-4 (1991) 76.

Takeuchi et al., "Optical Properties of Strained AlGaN and GaInN on GaN," *Jap. J. Appl. Phys.*, (1997) vol. 36, pp. L177-L179.

Taniyasu et al., "An aluminum nitride light-emitting diode with a wavelength of 210 nanometres", *Nature*, 441 (2006) 325.

Taniyasu et al., "Intentional control of n-type conduction for Si-doped AlN and $Al_xGa_{1-x}N$ ($0.42<x<1$)", *Applied Physics Letters*, 81 (2002) 1255.

Tavernier et al., "Chemical Mechanical Polishing of Gallium Nitride," *Electrochemical and Solid State Latters*, (2002) vol. 5, No. 8, pp. G61-G64.

Van de Walle et al., "Doping of AlGaN Alloys," *MRS Internet J. Nitride Semicond. Res.*, (1999) 4S1, G10.4, pp. 1-12.

Van de Walle et al., "DX-center Formation in Wurtzite and Zinc-blende AlxGa1-xN," *Phys. Rev.*, (1998) B57, R2033.

Vendl et al., "The melting points of some rare-earth metal nitrides as function of the nitrogen pressure", *High Temperatures—High Pressures*, 9 (1977) 313.

Vinogradov, "Determination of the Melting Parameters of Aluminum Nitride," *High Temperatures—High Pressures*, (1991) vol. 23, pp. 685-688.

Wentorf Jr., "Synthesis of the cubic form of boron nitride", *J. Chem. Phys.*, 34 (1961) 809.

Yamane et al., "Preparation of GaN single crystals using a Na flux", *Chem. Mater.*, 9 (1997) 413.

Yano et al., "Growth of nitride crystals, BN. AlN and GaN by using a Na flux", *Diamond and Related Materials*, 9 (2000) 512.

Ziesel et al., "DX-behavior of Si in AlN," *Phys. Res.*, (2000) B61, R16283.

Zhuang et al., "Seeded growth of AlN single crystals by physical vapor transport," *Jrl. of Crys. Growth*, (Jan. 25, 2006), vol. 287, No. 2, pp. 372-375.

\* cited by examiner

METHOD AND APPARATUS FOR PRODUCING LARGE, SINGLE-CRYSTALS OF ALUMINUM NITRIDE

RELATED APPLICATIONS

This application is a continuation of co-pending U.S. patent application Ser. No. 10/910,162, filed Aug. 3, 2004, which is a continuation-in-part of U.S. patent application Ser. No. 10/324,998 filed Dec. 20, 2002, entitled METHOD FOR PRODUCING LARGE SINGLE-CRYSTALS OF ALUMINUM NITRIDE, now issued as U.S. Pat. No. 6,770,135 on Aug. 3, 2004, and claims the benefit of U.S. Provisional Application Ser. No. 60/344,672, entitled METHOD FOR PRODUCING LARGE SINGLE-CRYSTALS OF ALUMINUM NITRIDE, filed Dec. 24, 2001. The entire disclosures of each of these applications are incorporated by reference herein.

GOVERNMENT SPONSORSHIP

The U.S. Government may have certain rights in this invention pursuant to SBIR Contract N00014-98-C-0053 awarded by the Office of Naval Research, under SBIR Contract F33615-00-C-5531 awarded by the Air Force Research Laboratory, and under SBIR Contract F33615-00-C-5425 awarded by the Missile Defense Agency.

FIELD OF THE INVENTION

The present invention relates to the growth of single-crystal Aluminum Nitride (AlN), and more particularly, to relatively large, single-crystal AlN, which are grown by sublimation-recondensation at growth rates exceeding 0.5 mm/hr.

BACKGROUND INFORMATION

Status of III-Nitride Technology Using Commercially Available Substrates

Several types of materials are routinely used to form semiconductor substrates. Sapphire is popular, because relatively high-quality, inexpensive sapphire substrates are commercially available. However, sapphire is far from being an ideal substrate for GaN epitaxy. Its lattice mismatch to GaN is large (about 16%), it has little distinction between the +and −[0001] directions which can give rise to +/−c-axis domains in epitaxial films of GaN, and its differential thermal expansion can lead to cracking during the cooling process after the device fabrication process. In spite of those problems, recently, Nichia Ltd (Japan) has announced the production of the first violet laser with commercial possibilities (more than 10,000 hours of operating life) using sapphire substrates. Currently, LDs (Laser Diodes) are selling for around 2,000 apiece. Using sapphire substrates leads to a costly fabrication process since it requires growing buffer layers and using Lateral Epitaxial Overgrowth techniques (LEO). Even though this announcement is very promising, Nichia's lasers still have problems. Some sources claim that heat builds up in these lasers as they shine. Sapphire, with a very low thermal conductivity, traps that heat, a fault that may trigger burnout down the road. To build an even more durable blue laser, Nichia and others are investigating other alternatives such as free-standing substrates. In this technique, the substrate is removed after a thick GaN layer is grown atop the sapphire. This method leaves the GaN as the base for building the laser. This base should be better at dissipating heat, in addition to matching the alloy layers above. However, this alternative may increase fabrication cost.

Single-crystal substrates of SiC are attractive due to their close lattice match to AlN/GaN in the plane perpendicular to the c-axis (the so-called c-plane) and high thermal conductivity. In addition, SiC substrates can be made electrically conducting, which is attractive for some applications (such as LEDs and LDs). However, 2H SiC (to match the 2H crystal structure of GaN) is not available and the lattice mismatch along the c-axis between GaN and both 4H and 6H SiC is substantial. In addition, the chemical bonding between the Group IV elements of the SiC and the Group-III or Group-V elements of the nitrides is expected to create potential nucleation problems leading to electronic states at the interface.

For devices that use GaN or $Ga_{1-x}In_xN$, nominally the most desirable substrate would be large area GaN single crystal wafers. Several methods to grow bulk GaN crystals have been proposed. While this possibility has become more attractive in the last few years, it does not appear to be commercially feasible to fabricate large bulk crystals of GaN in the short term.

It may therefore be desirable to provide alternative substrates such as AlN, for fabricating nitride-based (e.g., GaN) commercial devices. A sublimation-recondensation technique was developed for AlN crystal growth by Slack and McNelly (G. A. Slack and T. McNelly, J. Cryst. Growth 34, 263 (1976) and 42, 560 (1977), hereinafter the "Slack reference"). In this technique, polycrystalline source material is placed in the hot end of a crucible while the other end is kept cooler. The crystal nucleates in the tip and grows as the crucible is moved through the temperature gradient. This approach demonstrated relatively slow crystal growth of 0.3 mm/hr while the crystal growth chamber was maintained at 1 atm (100 kPa) of $N_2$. To make such substrates commercially feasible, it would be desirable to increase the growth rate. A number of researchers skilled in art have examined the possibility.

However, most artisans in this field have based their work on rate equations derived by Dryburgh (Estimation of maximum growth rate for aluminum nitride crystals by direct sublimation, J. Crystal Growth 125, 65 (1992)), which appear to overestimate the growth rate of AlN and, in particular, suggest that the maximal growth conditions are near stoichiometric vapor conditions, i.e., the Al and $N_2$ partial pressures should be adjusted so that the Al partial pressure is twice that of the $N_2$. This for example, is a significant teaching of U.S. Pat. Nos.: 5,858,085; 5,972,109; 6,045,612; 6,048,813; 6,063,185; 6,086,672; and 6,296,956; all to Hunter. In addition, the art teaches that the $N_2$ partial pressure should be maintained at less than atmospheric pressure.

Unfortunately, however, most attempts at increasing the growth rate of AlN crystals under such stoichiometric and/or sub atmospheric pressure conditions have met with limited success. In addition, it appears to be impossible to achieve the growth rate, or the electronics-grade quality Hunter discloses in his patents with the nitrogen pressure below one atmosphere.

Additional AlN work was completed by Segal et al. (A. S. Segal, S. Yu. Karpov, Yu. N. Makarov, E. N. Mokhov, A. D, Roenkov, M. G. Ramm, Yu. A. Vodakov, "On mechanisms of sublimation growth of AlN bulk crystals," J. Crystal Growth 211, 68 (2000)). While this work was published subsequently to the conception of the present invention, it appears to be the first peer reviewed publication to suggest that Dryburgh's growth equations are incorrect. Segal et al., however, teach growth conditions and experiments that are open, which allows the Al vapor to escape. Disadvantageously, it would be difficult to grow large boules of AlN this way since: (i) control of growth would be difficult (since it would be non-uniform across the surface), (ii) a large amount of Al would be wasted, (iii) the excess Al in the rest of the furnace would create problems because of its high reactivity, and (iv) it would be difficult to maintain high differences in temperature (ΔT) between the source and growing crystal surface.

A need therefore exists for electronics-grade AlN substrates that address the aforementioned drawbacks. A need also exists for high efficiency UV light emitting diodes and UV laser diodes.

The present invention meets these needs.

SUMMARY

An aspect of the invention includes an apparatus for the growth of bulk single crystal aluminum nitride. The apparatus includes a housing defining a growth chamber, the housing including a gas outlet configured for selectively evacuating and venting the growth chamber, a gas inlet configured for pressurizing the growth chamber, and a viewing port configured for pyrometric monitoring of crystal growth temperatures within the growth chamber. A radio frequency (rf) coil is disposed within the growth chamber and configured for inducing an electromagnetic field therein. A quartz tube is disposed coaxially within the coil. A first set of shielding is disposed coaxially within the quartz tube, including from about 5 to about 7 concentric pyrolytic boron nitride (pBN) cylinders, each of the pBN cylinders having a wall thickness of greater than about 0.05 inches (0.13 cm), each of the cylinders having a length dimension along the longitudinal axis greater than the length dimension of the coil. A second set of shielding is disposed coaxially within the first set of shielding, the second set of shielding including two concentric, open joint tungsten cylinders, each of the tungsten cylinders having a wall thickness of less than about 0.005 inches (0.013 cm); each of the tungsten cylinders having a length dimension along the longitudinal axis less than the length dimension of the rf coil. A push tube is disposed coaxially within the second set of shielding; the push tube having a proximal side and a distal side, the distal side including a set of metallic baffles having a center hole which provides for the pyrometric monitoring of crystal growth temperatures, the proximal side including another set of metallic baffles. A crucible is disposed coaxially within the push tube, the crucible having a conically shaped distal end and a proximal end; the crucible defining a crystal growth enclosure; the proximal end including a high purity, polycrystalline aluminum nitride source material, the distal end being configured for growth of the bulk single crystal aluminum nitride. The push tube is disposed on a push rod assembly configured for sliding the crucible and the push tube along the longitudinal axis. The first set of shielding and the second set of shielding are configured to provide a thermal gradient axially within the cavity of the crucible of greater than about 100° C./cm.

Another aspect of the invention includes a method for growing bulk single crystals of aluminum nitride. The method includes utilizing the apparatus described above, purging the growth chamber by evacuating the growth chamber to a pressure less than or equal to about 0.01 mbar (1 Pa), and refilling the growth chamber with substantially pure nitrogen gas to a pressure of about 1 bar (100 kPa). The growth chamber is then evacuated to a pressure less than or equal to about 0.01 mbar (1 Pa), and then pressurized to about 1 bar (100 kPa) with a gas including about 95% nitrogen and about 5% hydrogen. The chamber is heated to a first temperature, the heating including ramping the temperature of the conical upper end of the crucible to about 1800° C. in a period of about 15 minutes. The growth chamber is then pressurized to about 1.3 bar (130 kPa) with the gas including about 95% nitrogen and about 5% hydrogen, and heated to a growth temperature. A distal end of the crucible is then ramped to about 2200° C. in a period of about 5 hours. The push tube and the crucible are moved axially through the growth chamber at a rate of about 0.6 to about 0.9 millimeters per hour, wherein single crystals of aluminum nitride are grown.

A further aspect of the invention includes a method for growing bulk single crystals of aluminum nitride. The method includes evacuating a growth chamber, pressurizing the growth chamber to about 1 bar with a gas including about 95% nitrogen and about 5% hydrogen, and placing source polycrystalline AlN in a proximal end of a crystal growth enclosure. The method further includes placing a distal end of the crystal growth enclosure in a high temperature region of the growth chamber, ramping the high temperature region to about 1800° C., maintaining pressure in the growth chamber at about 1.3 bar, and ramping the high temperature region to about 2200° C. The distal end of the crystal growth enclosure is moved towards a low temperature region of growth chamber at a rate of about 0.6 to about 0.9 millimeters per hour, wherein a single crystal of aluminum nitride grows at the distal end of the crystal growth enclosure.

A still further aspect of the invention includes a method of producing bulk single crystals of AlN, which includes providing in a crystal growth enclosure Al and $N_2$ vapor capable of forming bulk crystals, maintaining in the crystal growth enclosure a $N_2$ partial pressure which is greater than the stoichiometric pressure relative to the Al, maintaining the total vapor pressure in the crystal growth enclosure at super-atmospheric pressure, and providing at least one nucleation site in the crystal growth enclosure. The method also includes cooling the nucleation site relative to other locations in the crystal growth enclosure, and depositing the vapor under conditions capable of growing single crystalline AlN originating at the nucleation site. A variation of this aspect includes producing a prepared substrate by cutting a wafer or a cylinder from the bulk single crystal; preparing a surface on the wafer or cylinder receptive to an epitaxial layer; and depositing an epitaxial layer or a complete crystal boule on the surface.

The invention also includes a system for producing bulk single crystals of AlN. The system includes a source of Al and $N_2$ vapor, a crystal growth enclosure for containing the vapor, and at least one nucleation site in the crystal growth enclosure. The crystal growth enclosure has a selective barrier configured to permit migration of $N_2$ therethrough, and to substantially prevent migration of Al therethrough. A pressurization system is configured to maintain in the crystal growth enclosure, a $N_2$ partial pressure greater than stoichiometric pressure relative to the Al, and to maintain the total vapor pressure in the crystal growth enclosure at super-atmospheric pressure. A selective heating system is configured to maintain the nucleation site at a temperature lower than at other locations in the crystal growth enclosure.

In another aspect, the invention includes a method for preparing a device, such as a solid-state laser diode or a solid state light emitting diode. The method includes forming a bulk, single crystal of aluminum nitride using any of the methods described above, followed by removing the bulk single crystal of aluminum nitride from the crystal growth enclosure and cutting to form a substrate of aluminum nitride. The method further includes depositing at least two layers onto the substrate of aluminum nitride, each of which is independently selected from the group consisting of AlN, GaN, InN, and any binary or tertiary alloy combination thereof.

Another aspect of the present invention includes a solid-state ultraviolet (UV) laser diode. The laser diode comprises at least two layers, each of which is independently selected from AlN, GaN, InN, or any binary or tertiary alloy combination thereof. The laser diode is disposed atop a substrate of AlN having a dislocation density of about 10,000 cm$^{-2}$ or less.

In yet another aspect, the present invention includes a solid-state ultraviolet (UV) light-emitting diode. The light emitting diode comprises at least two layers, each of which is independently selected from AlN, GaN, InN, or any binary or tertiary alloy combination thereof. The light emitting diode is disposed atop a substrate of AlN having a dislocation density of about 10,000 cm$^{-2}$ or less.

The present invention also includes a method of producing bulk single-crystal ZnO. The method includes providing Zn and $O_2$ vapor in a crystal growth enclosure, wherein the $O_2$ partial pressure is maintained at greater than stoichiometric pressure relative to the Zn partial pressure, providing at least one nucleation site in the crystal growth enclosure, cooling the at least one nucleation site relative to other locations in the crystal growth enclosure, and depositing the vapor under conditions capable of growing single crystalline ZnO originating at the at least one nucleation site.

BRIEF DESCRIPTION OF THE DRAWINGS

The above and other features and advantages of this invention will be more readily apparent from a reading of the following detailed description of various aspects of the invention taken in conjunction with the accompanying drawings, in which.

DESCRIPTION OF INVENTION

Figure 1:
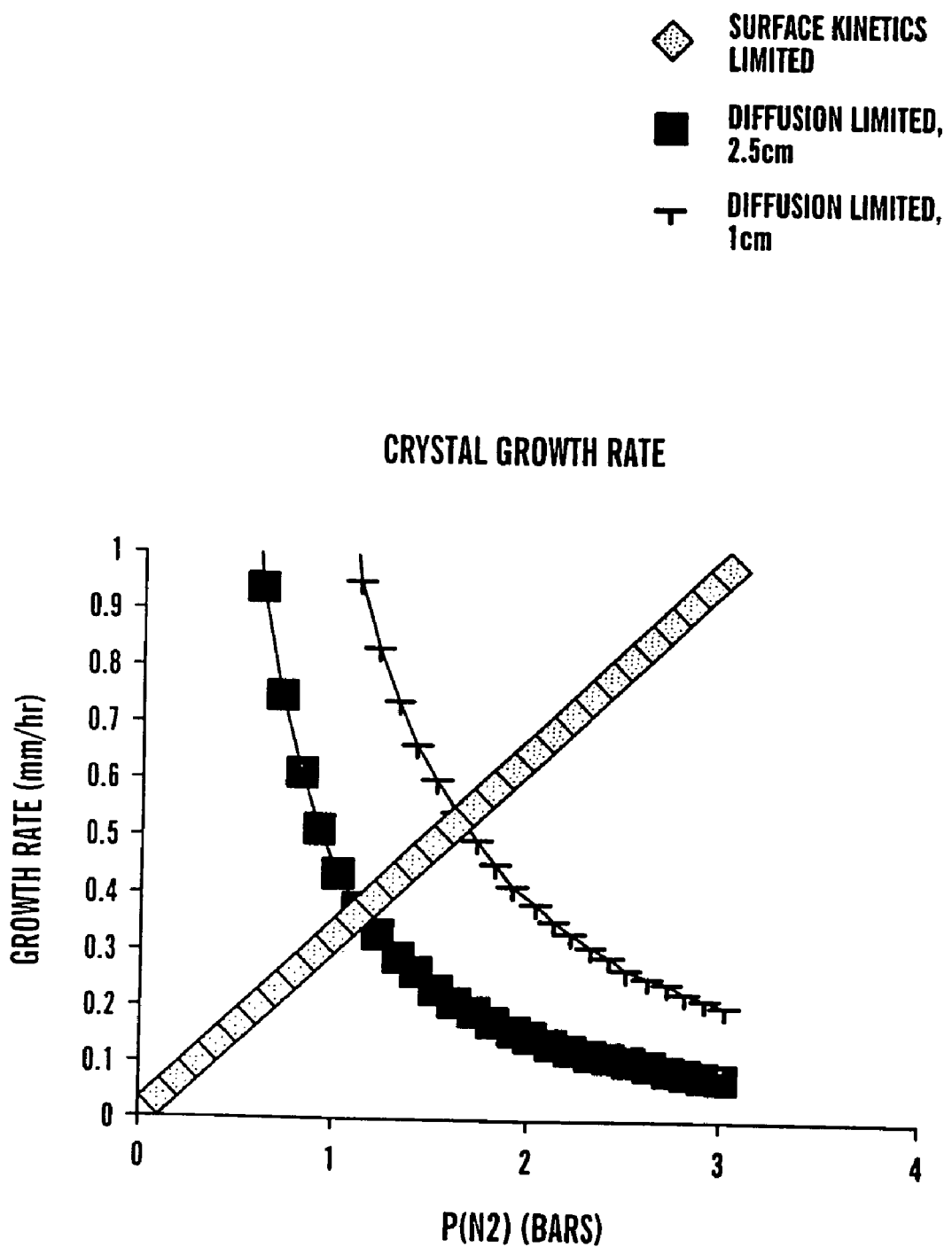
FIG. 1 is a graphical representation of crystal growth rate as a function of nitrogen pressure, determined in accordance with aspects of the present invention.

The present invention includes a method and apparatus for producing aluminum nitride (AlN) substrates that advantageously have a relatively small lattice mismatch (around 2.2%) with GaN, and have an almost identical thermal expansion from room temperature to 1000° C. Furthermore, AlN crystals grown by the present method have a low dislocation density of 10,000 cm$^{-2}$ or less and may be grown to have a radial dimension exceeding 10 mm and a length exceeding 5 mm. These AlN crystals also advantageously have the same wurtzite (2H) crystal structure as GaN and nominally the same type of piezoelectric polarity. Also, the chemical compatibility with GaN is much better than that of the SiC. In addition, AlN substrates cut from the bulk crystals tend to be attractive for $Al_xGa_{1-x}N$ devices requiring higher Al concentration (e.g., for high temperature, high power, radiation hardened, and ultra-violet (UV) wavelength applications).

Emerging optoelectronic and electronic devices based on the epitaxial growth of GaN and $Al_xGa_{1-x}N$ layers may significantly benefit from such an improved substrate. The size of the potential market, especially blue-violet light emitting diodes (LEDs) and laser diodes (LDs), and the current development state of devices based on the available substrates (sapphire and SiC) offer great possibilities to AlN as an alternative substrates to compete with those currently available. Also, the availability of high-quality AlN single crystal substrates can open new possibilities in other applications.

An aspect of the present invention is the recognition that, contrary to the teachings of the prior art, pressures above atmospheric pressure may be utilized to advantageously produce single AlN crystals at relatively high growth rates and crystal quality. The invention includes controlling the temperature difference between an AlN source material and growing crystal surface, the distance between the source material and the growing crystal surface, and the ratio of $N_2$ to Al partial vapor pressures. The invention includes increasing the nitrogen pressure beyond the stoichiometric pressure to force the crystal to grow at a relatively high rate due to the increased reaction rate at the interface between the growing crystal and the vapor. This increase in the growth rate has been shown to continue with increasing $N_2$ partial pressure until diffusion of Al from the source to the growing crystal (i.e., the negative effects of requiring the Al species to diffuse through the $N_2$ gas) becomes the rate-limiting step. The present invention also includes a technique for establishing suitable nitrogen pressures for crystal growth, as will be discussed in greater detail hereinbelow. Moreover, use of such higher-pressure nitrogen may have the added benefit that it reduces the partial pressure of aluminum inside the growth crucible. This may lead to longer crucible lifetimes and reduced wear on the rest of the furnace owing to a reduction in corrosion due to the Al vapor which may escape the crucible inadvertantly.

Figure 2:
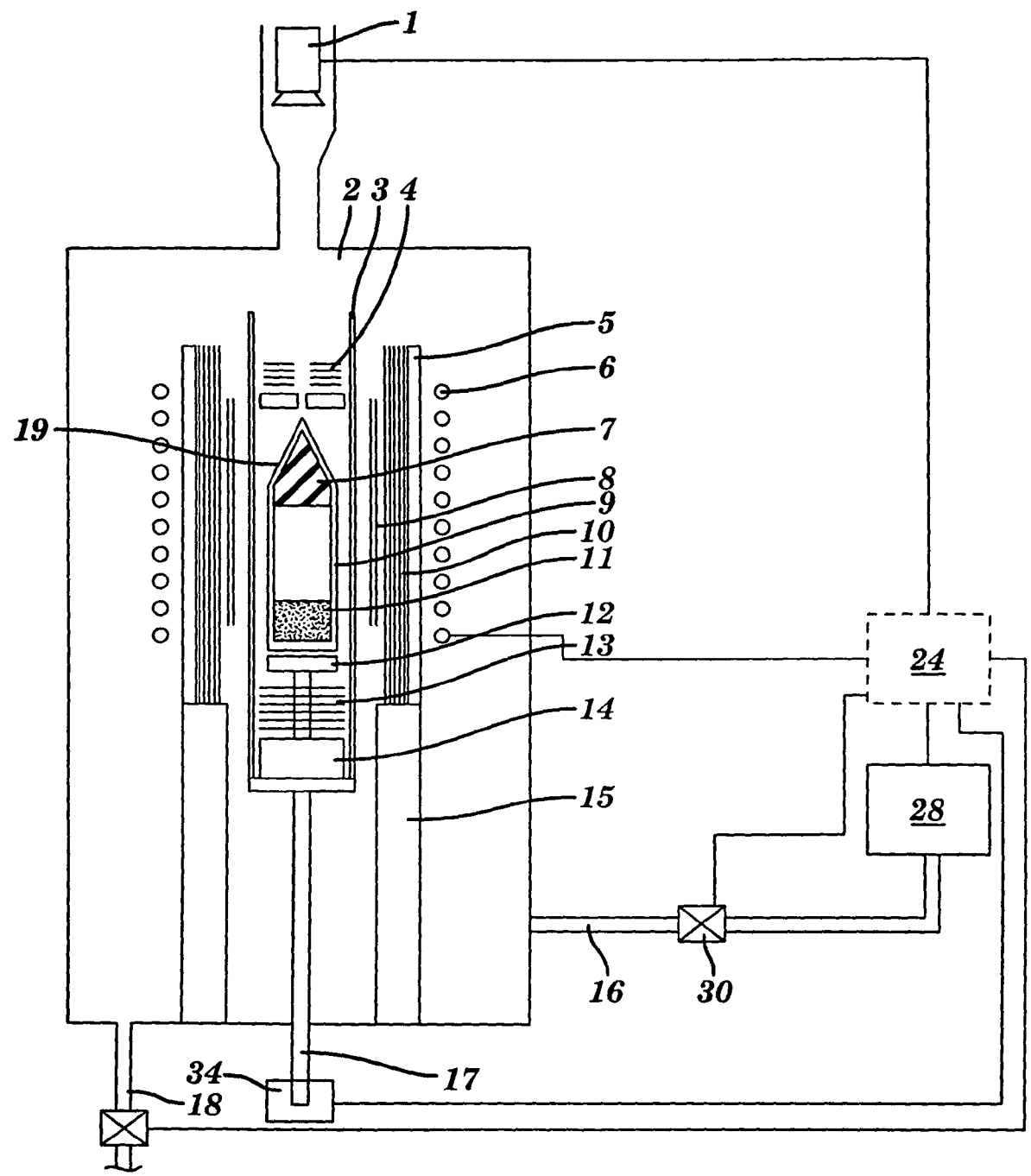
FIG. 2 is a schematic elevational view of an embodiment of an apparatus of the present invention.

The present invention also includes an apparatus (including a crystal growth enclosure or crucible) capable of providing a relatively sharp thermal profile, i.e., a relatively large thermal gradient along a relatively short axial distance, for sublimation and recondensation/nucleation. The crucible is configured to operate at an internal super-atmospheric pressure. During operation, the crystal nucleates at a nucleation site (e.g., at the tip of the crucible), and grows at a relatively high rate as the crucible moves relative to the temperature gradient. As used herein, the term 'axial' refers to a direction relative to the apparatus of the present invention, which is substantially parallel to push rod 17 as shown in FIG. 2. Moreover, the term 'nucleation site' refers to a location of either seeded or unseeded crystal growth.

Before describing the apparatus and method of operation in detail, a description of the development and theory of the invention is in order. As early as 1998, the inventors developed a model of $N_2$ and Al incorporation into a growing AlN crystal. Particular aspects of this model are discussed in greater detail hereinbelow. It was found that the $N_2$ molecule is relatively difficult to incorporate into a growing crystal, which leads to a small condensation coefficient for this molecule. For this reason, the rate at which $N_2$ molecules collide with the AlN surface (i.e., the $N_2$ flux) when the crystal is in equilibrium with a mixed vapor of Al and $N_2$, is much greater than the rate at which $N_2$ evaporates from the surface when the crystal is heated to the same temperature in a vacuum (the so-called Langmuir evaporation rate). Using only the equilibrium pressures and the measured Langmuir evaporation rate, the model was able to correctly predict the maximum rate that AlN crystals could be grown in atmospheric pressure $N_2$. More importantly, the model showed that the crystal growth rate, in sublimation-recondensation growth if limited only by the surface kinetics of $N_2$ incorporation, is directly proportional to the $N_2$ pressure up to high pressures, which may be as high as 200 bar (20 MPa). This result is quite different from most crystal growth systems where the kinetically limited growth rate at the surface is maximized when the gas mixture above the growing crystal surface has the same stoichiometry as the growing crystal. We also find that the Langmuir evaporation rate is almost 1000 times faster than the predicted AlN crystal growth rate at atmospheric pressure (even when diffusion is neglected). It is generally anticipated that one should be able to achieve growth rates comparable to the Langmuir evaporation by going to stoichiometric gas mixtures. However, the AlN crystal growth system is very different because of the difficulty in breaking the $N_2$ molecules into N atoms which are then incorporated into the growing crystal.

While not wishing to be tied to a particular theory, the teachings of the present invention enable this result to be understood by recognizing that the recondensation rate on the growing seed crystal matches the evaporation rate from the polycrystalline AlN starting material during steady-state crystal growth. The AlN starting material will sublime stoichiometrically and produce Al and $N_2$ vapor (the concentration of other gas species is believed to be too low to impact the growth rate). Thus, by controlling the nitrogen pressure externally, the Al partial pressure may rise until a steady state is achieved between evaporation at the hot surface and recondensation at the cold surface. Because of the low condensation coefficient for $N_2$, it has been found that the rate of evaporation/recondensation, as a function of temperature, is greater at nitrogen pressures that exceed the average stoichiometric pressure for AlN when the source material is AlN ceramic.

At relatively low $N_2$ pressures, for realistic temperature differences between the polycrystalline starting material (11, FIG. 2) and the seed (7, FIG. 2), this effect leads to relatively slow growth rates. This is a very different situation from crystal growth by sublimation/recondensation when both species have near unity accommodation coefficients such as the case in SiC.

Unfortunately, when the nitrogen pressure exceeds the stoichiometric partial pressure for a given partial pressure of aluminum (when stoichiometric, $P_{N2}=(\frac{1}{2})P_{Al}$), mass transport of the Al, relative to the nitrogen gas, to the growing crystal surface is generally needed. Thus, at some point, the growth rate becomes limited by diffusion of Al atoms through the gas phase even though the surface kinetics would continue to predict increased crystal growth rate with increasing $N_2$ pressure. Based on our current understanding of the surface kinetics involved, it has been found that this cross-over point is only slightly greater than 1 atmosphere for the growth geometry that was used by Slack and co-workers in the aforementioned Slack reference, and as shown in FIG. 1. However, during development of the present invention, it was found that this cross-over point is also dependent upon the diffusion lengths required for Al transport (which was approximately 2 to 5 cm in prior work). By reducing this (axial) length in embodiments of the present invention, which have been specifically configured to create a very sharp thermal profile in the work zone, it is has been found possible to significantly increase the growth rate relative to prior approaches.

Turning now to FIG. 1, the predicted AlN growth rate is shown as a function of $N_2$ pressure. The curves labeled with squares and crosses show the growth rates assuming that it is limited by the diffusion of Al (for a 2.5 cm or 1 cm diffusion length, respectively) with no convection, while the third curve shows the predicted growth rate assuming that the growth rate is limited by the surface kinetics of nitrogen incorporation (ignoring gas-phase diffusion). The model assumes that the AlN source material is at 2300° C. while the growing crystal is maintained at 2200° C. These calculations also assume that the area of the evaporating surface and that of the growing crystal are equal and that diffusion effects may be neglected. This last assumption, as shown, ceases to be true at high enough $N_2$ pressure. The cross-over point generally depends on the experimental geometry.

Embodiments of the present invention have demonstrated that the problem with diffusion described above can be circumvented, at least in part, by providing a net flow of gas from the source (11, FIG. 2) towards the growing crystal (7, FIG. 2) greater than that caused simply by the evaporation and recondensation process. This may be obtained when a thin wall tungsten crucible (9, FIG. 2) is used, and it may also be possible to obtain this effect with other crucible materials that are pervious to nitrogen gas, or with other types of selective barriers such as openings 20, 21, described hereinbelow with respect to FIGS. 3-5. Nitrogen is able to diffuse through thin-walled tungsten (W) crucibles at fairly high rates at the crystal growth temperatures (~2300° C.) used. The diffusion rate of Al through the W walls is much lower. Thus, under equilibrium conditions, the partial pressure of nitrogen inside the crucible is identical to that outside (e.g., in chamber 2, FIG. 2) the crucible, while the total pressure of gasses inside the crucible may be higher due to the partial pressure of the Al vapor.

However, once crystal growth is initiated and the AlN source is maintained at a higher temperature than the growing crystal, the nitrogen partial pressure at the cool end (e.g., location 19 of the growing crystal 7) of the crucible tends to become greater than at the hot end, while the opposite is true for the aluminum pressure. Meanwhile, the total gas pressure inside the crucible remains substantially uniform throughout to maintain mechanical equilibrium. (As used herein, the term 'mechanical equilibrium' refers to instances in which the total vapor pressure interior and exterior to the crystal growth chamber are substantially equal.) Thus, the nitrogen partial pressure at the cold end 19 of the crucible tends to exceed the nitrogen pressure outside the crucible (within chamber 2) while the opposite is true at the hot end. For this reason, nitrogen tends to diffuse out of the crucible at the cold end and diffuse into the crucible at the hot end resulting in a net flow of the gas mixture in the crucible from the AlN source toward the growing crystal.

While the understanding of this operation is new, its effect is consistent with the experimental results achieved by Slack and McNelly (in the aforementioned Slack reference) since their observed crystal growth rate of 0.3 mm/hr nominally could not have been achieved otherwise. In addition, Slack and McNelly observed that when pinholes formed in the CVD W crucibles that they used, all the AlN vapor would escape. It has been discovered by the present applicants that this occurs because (as explained above) the total gas pressure in the crucible is greater than the nitrogen pressure outside the crucible. Once a pinhole opens up, the gas mixture in the crucible (containing Al and $N_2$) starts being pushed out the hole. However, in this instance, nitrogen gas continues to diffuse from the outside through the walls of the crucible because the partial pressure of $N_2$ is lower in the crucible than it was outside. Thus, the pressure in the crucible may be kept higher than the outside even when a pinhole is continuing to vent the gas mixture from the crucible. The process typically continues until substantially all of the Al vapor inside the crucible is exhausted.

Another source of additional gas flow may be generated by the selective absorption of Al by the crucible walls.

Figure 3:
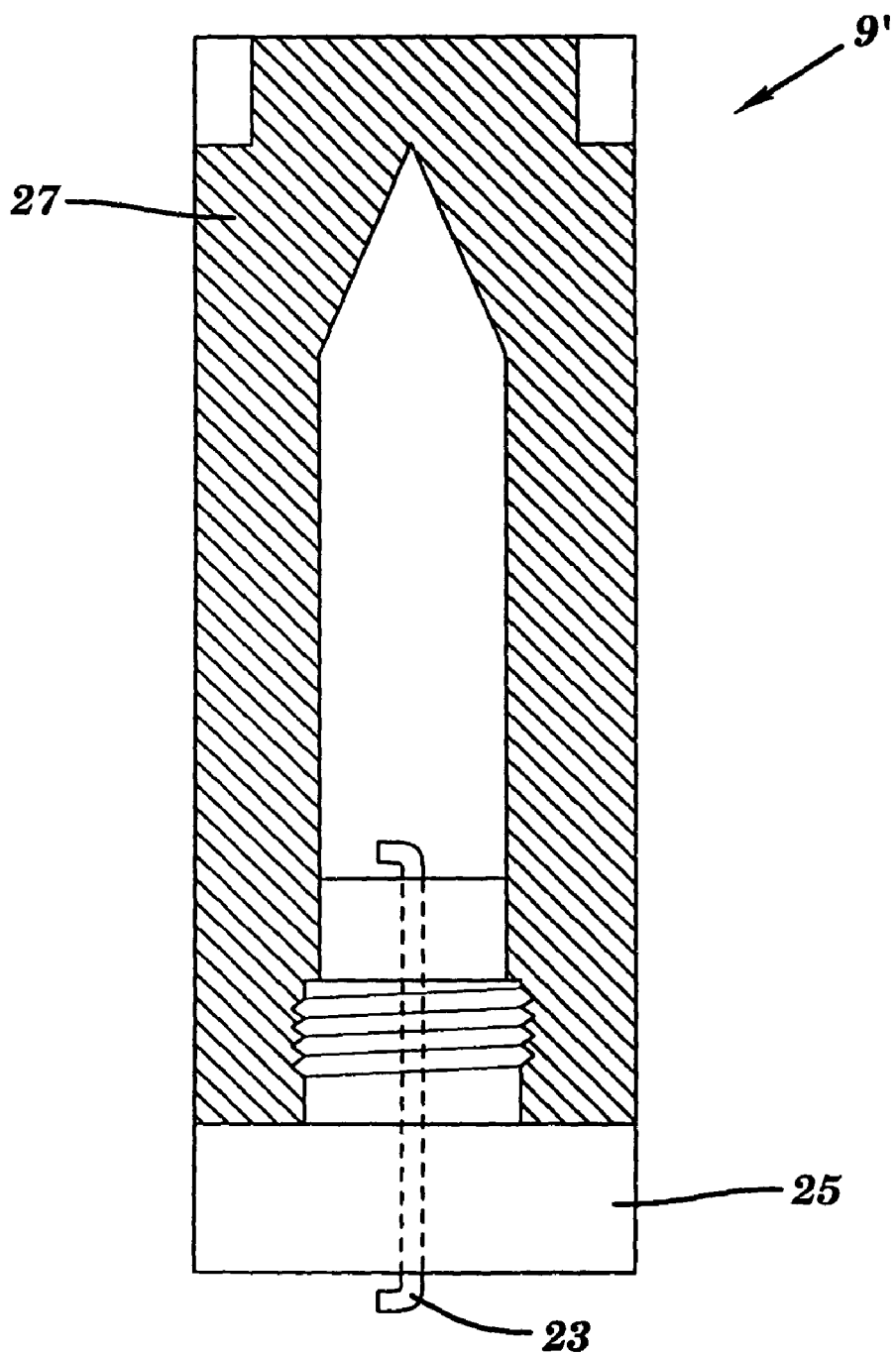
FIG. 3 is a schematic elevational view of an alternate embodiment of a portion of the present invention useful with the apparatus of FIG. 2.
Figure 4:
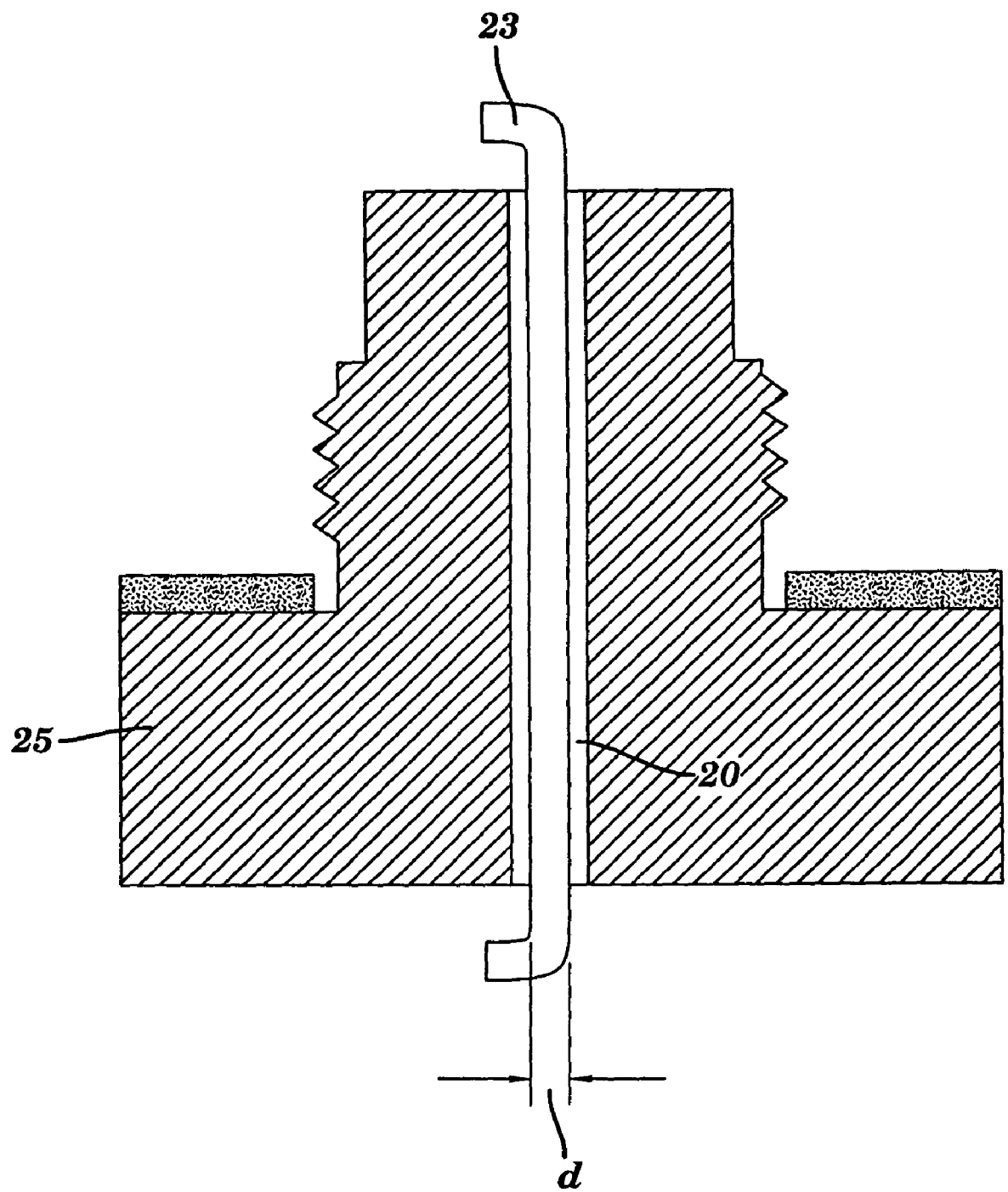
FIG. 4 is a schematic elevational view, on an enlarged scale, of a portion of the embodiment shown in FIG. 3.

Thus, in particular embodiments of the present invention, a crucible may be provided with one or more openings (e.g., 20, 21) to facilitate nitrogen pressure control/equilibration of the crucible, as will be discussed in greater detail hereinbelow with respect to FIGS. 3-5.

Growth Rate Model

As mentioned hereinabove, an aspect of the present invention was the understanding of the applicable surface kinetics. The rate at which Al and N incorporate into the growing AlN has generally been modeled in two approaches. In the first, it is assumed that the nitrogen molecules $N_2$ have a relatively low condensation coefficient compared to the Al atoms due to a configurational barrier. In the second approach, it is assumed that the $N_2$ molecules physisorb onto the AlN surface. These $N_2$ molecules are then assumed to be kinetically hindered in the production of N atoms that can then incorporate into the AlN crystal. We have modeled both approaches and both models lead to identical results.

The rate of change of the surface concentration [Al] of aluminum may be given by $$\frac{d[Al]}{dt} = \beta_{Al}P_{Al} - C_{Al}[Al] - B\left([Al] - \frac{K_s}{[N]}\right). \quad (1)$$

Likewise, the rate of change of the surface concentration [N] of nitrogen atoms is $$\frac{d[N]}{dt} = 2\gamma\beta_{N2}P_{N2} - C_N[N]^2 - B\left([Al] - \frac{K_s}{[N]}\right). \quad (2)$$

In these equations, the first term represents the addition of molecules from the vapor. It is assumed that all of the Al atoms stick but only a fraction $\gamma$ of the $N_2$ molecules condense on the surface. The term $\beta_i$ represents the modified Hertz-Knudsen factor which is proportional to the square root of mass of the $i^{th}$ species (where i represents either Al or $N_2$) divided by the temperature. The condensation coefficient $\gamma$ in this model is not subscripted since we assume that it only applies to the $N_2$ molecules.

In the equations above, the second term represents the evaporation of molecules into the vapor. The $C_i$ term is a parameter introduced to describe the rate of evaporation of the $i^{th}$ species. Note that the evaporation of $N_2$ molecules proceeds like the square of the [N] concentration on the surface. Finally the last term represents the incorporation (or dissolution) of Al and N atoms into the crystal where B is another parameter that is introduced. We assume that [Al] and [N] maintain an equilibrium concentration on the surface so as to obey $$[Al]\cdot[N]=K_s, \quad (3)$$

where $K_s$ is the equilibrium constant. We also assume that the N and Al atoms on the surface come into equilibrium very rapidly, which can be modeled by making the assumption that B is very large. This tends to constrain the [Al] and [N] concentrations to obey equation (3) almost exactly. The deviation from equilibrium tends to be just large enough so that the time derivatives of [Al] and [N] are equal to zero once steady state is achieved. The actual value of B is typically irrelevant under these circumstances.

These rate equations lead to a relatively simple cubic equation describing the net flux $F_{AlN}$ onto/off the surface of the AlN crystal, $$\left(\frac{E_L^3 P_{N2}}{4\beta_{Al}^2 P_s^3} - F_{AlN}\right)\cdot(\beta_{Al}P_{Al} - F_{AlN})^2 = E_L^2. \quad (4)$$

Significantly, the only parameters appearing in this cubic equation are the Langmuir evaporation rate $E_L$ and the stoichiometric nitrogen pressure $P_s$. It is rather remarkable that, in the limit of very large B, of the five free parameters that appear in Eqs. (1) and (2), only two parameters are needed in Eq. (4) to determine the net flux at any nitrogen and aluminum partial pressure. Both of these parameters have been determined experimentally although there is substantial uncertainty in the Langmuir evaporation rate as pointed out earlier.

These equations thus support the use of increasing nitrogen pressure beyond stoichiometric pressures, which is contrary to prior teachings as discussed hereinabove.

In the limit of a small value of $\gamma$, on the order of $10^{-5}$, it is possible to linearize this expression to give $F_{AlN}$ as a linear function of $P_{N2}$. The growth rate can be determined by setting $$F_{AlN}(T_H)=-F_{AlN}(T_C). \quad (5)$$

We have determined a simple expression for this growth rate that depends on the difference in temperature $\Delta T=T_H-T_C$ and on the nitrogen pressure, which may be controlled independently. If the effects of diffusion are ignored (so that the partial pressures of $N_2$ and Al are constant in the region between the source and seed), for a given $\Delta T$ and $N_2$ pressure, the Al pressure tends to adjust itself to some value intermediary to the equilibrium Al pressures at the hot and cold surfaces so as to force Eq. (5) to be true. In this case, $$F_{AlN}=A_o(\Delta T, T_H)P_{N2}. \quad (6)$$

The value of $F_{AlN}$ is linear in $\Delta T$ for $\Delta T \leq 100°$ C. We find that the linear dependence of $F_{AlN}$ on $P_{N2}$ is valid (within 1%) between 0 and 200 bars of nitrogen gas for the experimentally determined values of $E_L$ and $P_s$ in the temperature range $2000°$ C.$<T_H<2500°$ C. We have determined $$A_o(\Delta T=50° C., T_H=2300° C.)=0.156 \text{ mm}\cdot\text{hr}^{-1}-\text{bar}^{-1}, \quad (7)$$

using the data of Bolgar et al. (A. S. Bolgar, S. P. Gordienko, E. A. Ryklis, and V. V. Fesenko, in "Khim. Fiz. Nitridov", p. 1514 (1968) [Chem. Abstr. 71, 34003j (1969)]). for the Langmuir evaporation rate (259 mm/hr) and the equilibrium, stoichiometric nitrogen pressure determined from the JANAF tables (M. W. Chase et al. "JANAF Thermochemical Tables", Third Edition (1985), see J. Phys. Chem. Ref. Data 14, Supplement No. 1 (1985)), $P_s(2300°$ C.)=0.13 bar. This equilibrium pressure would lead to an effective growth rate of 18.9 mm/hr if all the nitrogen and aluminum stuck to the surface without re-evaporation and $P_{Al}=2P_{N2}=P_s$, such as shown in FIG. 1. These calculations assume that the area of the evaporating surface and that of the growing crystal are equal and that diffusion effects may be neglected. This last assumption is rather important and, as FIG. 1 shows, ceases to be true at high enough $N_2$ pressure.

The observed growth rate in the Slack reference for $T_H=2300°$ C. and $T_C\sim2200°$ C. run in 0.95 bar of $N_2$ plus 0.05 bar of $H_2$ was 0.3 mm/hr. This should be compared with the theoretically determined growth rate of 0.32 mm/hr. This is a remarkable agreement given the uncertainties in the experimental data for the Langmuir evaporation rate and in the measured growth rate by Slack and McNelly. Note that there are no adjustable parameters in the way that this theory was developed, the theory only depends on the experimentally determined equilibrium pressures and the measured Langmuir evaporation rates. Note also that the experiment was conducted in a crucible where the growing crystal surface was smaller than the evaporating AlN source material. This tends to lead to an amplification of the observed growth rate. It should also be noted that these equations predict a theoretical growth rate of 0.020 mm/hr at the stoichiometric nitrogen pressure (0.13 bar) at a source temperature of 2300° C. and a $\Delta T$ of 50° C.

Crystal Growth Furnace

Turning now to FIG. 2, the apparatus (e.g., furnace) of the present invention is described. As shown, the furnace includes a heating source 6, such as a radio-frequency coil, that induces an electromagnetic (EM) field within growth chamber 2. This EM field couples with a metallic susceptor (push tube) 3 located concentrically inside the coil and provokes heat generation by the Joule effect on it. (Although in a useful embodiment, susceptor/tube 3 is cylindrical, i.e., has a circular axial cross-section, as used herein, the terms 'tube' or 'tubular' also include tubes of non-circular axial cross-section.) The relative position and dimension of the push tube with respect to the shielding elements and coil creates a thermal gradient along the walls of the susceptor 3, i.e., in the axial direction. A crucible 9 is disposed concentrically within tube 3, and includes the highly purified source material 11 at a proximal end thereof (polycrystalline AlN) and eventually, the growing AlN crystal 7 at the distal end (e.g., at tip 19) thereof.

The crucible 9 may be fabricated from material such as tungsten or rhenium or tantalum nitride, having walls such as discussed hereinabove, which are thin enough to form a barrier which selectively permits and prevents the respective diffusion of nitrogen and aluminum, therethrough. Alternatively, the crucible may be configured with openings configured to effect similar selectivity, as discussed in greater detail hereinbelow.

Metallic baffles 13, 4 are disposed at proximal (e.g., bottom) and distal (e.g., top) ends, respectively, to help control the temperature gradient along the crucible axis. One may selectively remove some of the baffles from the distal end relative to the proximal end to achieve the desired temperature gradient. The top set of baffles may include a center hole that facilitates temperature measurement at the tip of the crucible using a conventional pyrometer 1. If the operational conditions are adequate in terms of pressure, temperature, and displacement rate of the crucible respect to the gradient, a single crystal boule 7 is formed at the distal (tip 19) end of crucible 9.

An aspect of this invention is the arrangement of the shielding elements in the system that allows setting an adequate thermal gradient along the walls of push tube 3. As shown, there are two distinct sets of shielding elements around the push tube. The first set includes two concentric open-joint tungsten cylinders 8, each having a thickness of less than about 0.005" in a desired embodiment. The skilled artisan will recognize that other refractory metals such as molybdenum or rhenium may be substituted for W. The term 'open-joint' refers to the cylinders 8 having an open longitudinal seam (i.e., the cylinders to not extend a full 360 degrees) so that there is no continuous electrical path around the cylinder. This helps to prevent the cylinders from coupling to the rf fields and becoming too hot and/or absorbing power intended for heating the crucible. Both the open-joint and the thickness are chosen to minimize the coupling between these metallic parts and the 450 MHz rf electromagnetic field. In addition, cylinders 8 are preferably axially shorter than rf coil 6 and located nominally in the center of the coil 6 (e.g., both concentrically with coil 6 and equidistantly from both (axial) ends thereof) to avoid inducing local non-axial-symmetric hot spots on shields 8. The second set of shields 10 desirably include pyrolitic boron nitride (pBN) cylinders (e.g., approximately five to seven cylinders, in particular embodiments), which in desirable embodiments, are at least 0.050 inches (1.3 mm) thick and several centimeters longer than rf coil 6. While a purpose of the pBN shields 10 is to thermally insulate the tube 3 to obtain the desire temperature in the work zone, the mission of the metallic shields 8 is two-fold. Shields 8 serve as heat reflectors causing the temperature in the center of the hot zone to be much higher than at the coil ends. In addition, they serve to protect the push tube 3 from picking up boron generated by the continuous sublimation of the pBN shields 10. (Boron has a eutectic point with tungsten at the growth temperatures used in this invention if the boron concentration exceeds some value. Once the boron picked up by the push tube is higher than that value, a liquid phase tends to form on the skin of the push tube leading to its failure.) The shielding arrangement described hereinabove advantageously produces a sharp thermal gradient on the crucible 9 (e.g., over 100° C./cm) as its tip 19 moves axially beyond the metallic shields 8. As discussed hereinabove, this relatively large gradient has been shown to facilitate large growth rates. As also shown, the shields 8, 10 may be enclosed in a dielectric tube (5) fabricated from quartz or other suitable material, to insulate the coil 6 from the metallic elements of the system and prevent arcing, etc. with them.

As also shown, the furnace includes a crucible pedestal 12 disposed within push tube 3, for supportably engaging crucible 9 within tube 3. The push tube 3 is itself supported by push tube pedestal 14, which is engaged by push rod 17 for axial actuation thereby. Shielding pedestal 15 supportably engages pBN shields 10, and gas outlets and inlets 16 and 18, respectively enable vacuum/venting and pressurization.

In alternate embodiments of the present invention, as shown in phantom, the apparatus of the present invention may include a controller 24, such as one or more computers or microprocessors and suitable instruction set(s) (e.g., software), coupled to actuators and the like, sufficient to automate all or portions of the operation of the furnace. For example, as shown, controller 24 may be communicably coupled to heater 6 and to pyrometer 1, to form a conventional closed-loop system capable of maintaining chamber 2 at desired temperatures in response to execution of various temperature ramp routines by the controller. Controller 24 may be similarly coupled to a conventional vacuum pump 28, and to an electronically actuatable valve 30 disposed at gas outlet 16, to automatically effect evacuation and venting of chamber 2. Controller 24 may also be coupled to valve 32 disposed at gas inlet 18 to effect pressurization of the chamber, while the controller is also coupled to an actuator 34 to automatically control operation of push rod 17. The skilled artisan will recognize that controller 24 may be coupled to conventional pressure and position sensors (not shown) disposed within chamber 2 to provide closed-loop feedback to control the gas pressure and push rod position.

In still further embodiments, crucible 9 may be provided with one or more openings 20 or 21 that allow the nitrogen partial pressure inside the crucible to be controlled by the nitrogen ($N_2$) pressure outside the crucible, while minimizing the amount of Al vapor that escapes from crucible 9. This goal may be accomplished by allowing the nitrogen to diffuse through a relatively thin-walled tungsten (W) crucible, such as used in the Slack reference. Such a W crucible may be welded shut so the only route for Al to escape the crucible is by diffusion through the walls. Since $N_2$ is able to diffuse through W much more rapidly than Al, this procedure was effective. In this event, the walls of the crucible need to be kept relatively thin to allow the $N_2$ inside to equilibrate with the $N_2$ outside in a reasonable amount of time. Otherwise, the time required to equilibrate (i.e., through relatively thick-walled crucibles may be prohibitive. Disadvantageously, however, relatively thin-walled W crucibles tend to have a lifetime that is too short to grow relatively large crystals. Other disadvantages of this thin-walled approach include the need to evacuate the crucible prior to electron-beam welding, and the expense of such welding.

Thus, embodiments of the present invention provide mechanical approaches to allow the nitrogen to equilibrate, while minimizing the escape of Al vapor. Turning now to FIGS. 3-4, one approach is shown as used in a two-piece crucible 9', which includes a base portion 25 which is thread-ably engagable with a tip portion 27. This approach includes providing (e.g., by drilling) a hole 20 in crucible 9' to allow nitrogen flow during heating phases 40, 44 (described hereinbelow), but which is small enough to allow only minimal diffusion of Al vapor through the hole once the total pressure in the crucible is equal to the total pressure outside the crucible. As best shown in FIG. 4, in particular exemplary embodiments, this may be accomplished by drilling a 25 mil (0.63mm) diameter hole 20 into proximal end 25 of crucible 9', (although it may also be provided elsewhere, such as in distal end 27) and then using a 20 mil (0.50 mm) diameter wire 23 to plug the hole. The nominally 0.13 mm clearance (best shown in FIG. 4) provided by this assembly has been shown to successfully allow the nitrogen pressure to equilibrate prior to growth and, during growth. Moreover, it was small enough so that the diffusion of Al vapor through it was acceptably low, or was so small that it effectively became plugged during growth, to substantially prevent Al diffusion. The skilled artisan will recognize that this crucible 9' may be used with or without hole 20 and wire 23.

Figure 5:
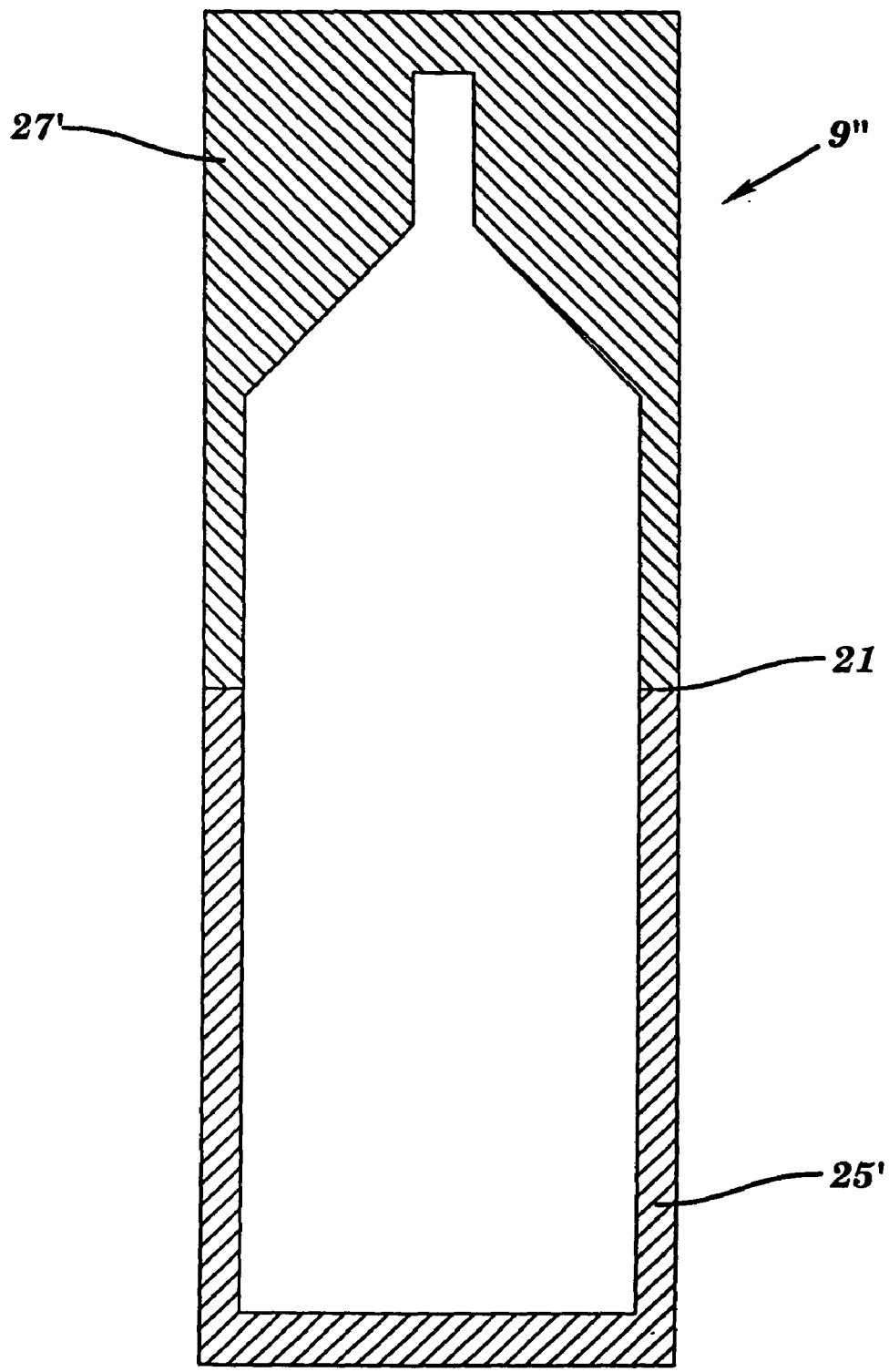
FIG. 5 is a schematic elevational view of another embodiment of the portion of the present invention shown in FIG. 3.

Turning now to FIG. 5, as mentioned above, another approach is to provide a horizontal-seal (opening) 21, by providing a two-piece crucible 9'' including the proximal end 25' containing source 11, and the distal end 27' containing crystal 7. The mating surfaces of the two ends that form seal 21 are configured to be sufficiently smooth so that there is little, if any, ability for gas to diffuse therethrough if the interior and exterior crucible pressures are at equilibrium. However, the seal 21 will permit (i.e., be unable to resist) gas flow from either inside the crucible or outside the crucible if the pressures are not substantially equal. As shown, seal 21 is disposed in a substantially central region of the crucible where no deposition of AlN will occur, e.g., by disposing the seal in the hottest region of the crucible 9' during crystal growth. This disposition of the seal effectively prevents the AlN growth from opening seal 21 and thereby permitting unacceptably high levels of Al vapor diffusion therethrough.

Having described the principles and apparatus of the present invention, the method of operation, i.e., the actual growth process using the system described above, is now described in conjunction with the following Table 1.

TABLE 1

| | |
|---|---|
| 30 | Evacuate chamber |
| 32 | Refill chamber with nitrogen gas |
| 34 | Repeat steps 30, 32 |
| 36 | Pressurize chamber to 1 bar with a gas comprising about 95-100% $N_2$ and 0-5% $H_2$ |
| 37 | Place source material in proximal end of crucible |
| 38 | Place crucible in tube, with tip 19 in high temperature region at proximal end of shield 8 |
| 40 | Ramp temperature of crucible tip to about 1800° C. |
| 42 | Maintain gas at a predetermined super-atmospheric pressure |
| 44 | Ramp temperature to growth temperature |
| 46 | During step 44, continuously adjust pressure to maintain it at the pressure of step 42 |
| 48 | Once growth temperature is reached, pushrod is actuated to move crucible tip towards distal end of chamber 2 |
| 50 | Maintain constant pressure during step 48 |
| 52 | Stop movement of push rod 17 |
| 54 | Ramp furnace to room temperature |

Crystal growth initially involves evacuating 30 the chamber 2 (FIG. 2) e.g., to pressures on the order of 0.01 mbar (1 Pa) using a vacuum pump. The chamber 2 is then refilled 32 with nitrogen gas. This step is preferably repeated 34 several times to minimize oxygen and moisture contamination. The chamber is then pressurized 36 to about 1 bar (100 kPa) with nitrogen gas which is preferably mixed with a small amount of hydrogen. For example, a gas including about 95-100% $N_2$ and 0-5% $H_2$ is useful. Exemplary embodiments use about 3% $H_2$ and 97% $N_2$ due to commercial availability of gas premixed at these percentages. Polycrystalline AlN source material 11 is placed 37 at a proximal end of crucible 9. The crucible 9 may then be evacuated and sealed, or may be provided with openings 20, 21 as described hereinabove. The crucible is then disposed 38 concentrically within tube 3, with tip 19 in the high temperature region of the furnace (i.e., nominally within the proximal end of shield 8). The temperature is then ramped 40 to bring the tip of the crucible to a temperature of approximately 1800° C., in particular embodiments, within about 15 minutes. At the end of this temperature ramp, the gas pressure is set and maintained 42 at a predetermined super-atmospheric pressure, and the temperature is ramped 44 to a final crystal growth temperature, e.g., in about 5 hours. During this ramping 44, the pressure is continuously adjusted 46, e.g., using a vent valve (not shown) to maintain it at that fixed value. The goal of this ramping 44 is to enhance the purity of the source material 11 by permitting part of the oxygen still contained within it to diffuse out of the crucible (e.g., through the crucible walls). This diffusion occurs because the vapor pressure of the aluminum suboxides (such as $Al_2O$, AlO, etc.), generated due to the presence of oxygen in the source material, is known to be higher than that of Al over AlN for the same temperature.

Once the growth temperature is reached, the pushrod is actuated 48 to move crucible tip 19 towards the distal end of chamber 2, and relative to the thermal gradient. As discussed hereinabove, the crucible tip 19 is initially located within the highest temperature region of the susceptor 3 at the beginning of the growth run. As the push tube moves upwards (i.e., towards the distal end of the furnace 2, tip 19 becomes cooler than the source material 11 which promotes effective mass transport from the source material 11 to the colder tip 19 of the crucible. (As shown and described, the push tube 3, including crucible 9 disposed therein, is moved axially upon actuation of push rod 17. However, push rod 17 may alternatively be configured to move crucible 9 axially relative to tube 3, without departing from the spirit and scope of the present invention.)

During the growth process, the pressure is maintained at a constant predetermined value. The most appropriate value for this pressure typically depends on the axial spacing between the source material 11 and the (closest) surface of the growing crystal 7, as well as the rate of nitrogen diffusion through the crucible walls or flow through the predrilled holes. It may also be appropriate to actively adjust the gas pressure over a relatively narrow range during crystal growth to compensate for any changes in the spacing between the surface of the sublimating source and growing crystal surface.

In particular embodiments, a value of 18 psi has been used to demonstrate growth rates of 0.9 mm/hr with a source 11 to crystal surface 7 separation of approximately 2 cm and the use of either CVD W (Chemical Vapor Deposited Tungsten) or powder metallurgy W crucibles (such as described in commonly assigned U.S. patent application Ser. No. 10/251106, entitled, Power Metallurgy Tungsten Crucible for AlN Crystal Growth, which is fully incorporated by reference herein). The source to growing crystal surface distance may vary during the growth run if the area of the growing crystal surface is different than the surface area of the source material and the growth rate (i.e., axial rate of movement of the crucible through the temperature gradient) may need to be adjusted to account for this change. However, typically the surface area of the source and growing crystal surface will be kept nominally constant and approximately the same size so that the separation between the source and growing crystal surface will remain about constant during most of the growth.

Finally, the movement is stopped 52 and a cooling ramp 54 is established to bring the system to room temperature. Using pressures in the range 100 kPa to 150 kPa (1 atm to 1.5 atm), single crystal boules have been grown at an axial pushing rate ranging between 0.6 and 0.9 mm/h. By adjusting the distance between the source material and the growing crystal surface, and by adjusting the temperature gradient, other useful growth conditions may be obtained. Hence, skilled practitioners may usefully use various embodiments of the present invention with total chamber pressures from 50 kPa to 1 MPa (0.5 atm to 10 atm) and axial pushing/growth rates of 0.5 to about 3 mm/h.

Advantageously, embodiments of the present invention provide an AlN crystal growth system capable of controlling the $N_2$ partial pressure independently of the Al partial pressure, while substantially preventing significant amounts of Al from escaping from the growth crucible. These embodiments thus teach and facilitate use of partial nitrogen pressures greater than stoichiometric, and the use of total vapor pressures at super atmospheric levels (i.e., greater than 1 (one) atmosphere).

Furthermore, by slicing or cutting the bulk AlN crystals of the present invention, crystalline AlN substrates can be produced. These substrates can then be prepared, typically by polishing, for high quality epitaxial growth of appropriate layers of AlN, GaN, InN and their binary and tertiary alloys to form UV laser diodes (LDs) and high efficiency UV light emitting diodes (LEDs). The aforementioned nitride layers can be described by the chemical formula $Al_xGa_yIn_{1-x-y}N$ where $0 \leq x \leq 1$ and $0 \leq y \leq 1-x$.

The surface preparation of the AlN is critical to obtaining high quality epitaxial growth of the nitride layers on the AlN substrate. Surface damage must be carefully removed in order to obtain high quality epitaxial layers needed for fabrication of high performance nitride semiconductor devices. One successful approach to remove surface damage from the AlN substrate is to use a chemical-mechanical polishing (CMP) approach such as described in co-pending commonly assigned U.S. patent application Ser. No. 10/300,481. Through this approach, it has proven possible to produce very high quality epitaxial layers of $Al_xGa_yIn_{1-x-y}N$ using organo-metallic vapor phase epitaxy (OMVPE) with low dislocation densities, particularly when x exceeds 0.5. Those skilled in the art will recognize that other epitaxial growth techniques such as molecular beam epitaxy (MBE) or hydride vapor phase epitaxy (HVPE) may also be successfully used to produce high quality epitaxial layers on the low dislocation density AlN substrates of the present invention.

The present invention also includes a method for making solid-state UV laser diodes (LDs) and UV light emitting diodes (LEDs), as well as the devices themselves. The LDs and LEDs are fabricated on AlN substrates made by the present process, preferably emitting at wavelengths ranging from about 200 nm to about 320 nm. Furthermore, the solid state UV LEDs made by the present method exhibit a high efficiency wherein the fraction of electric power converted into UV radiation (total energy per unit time delivered to the device) converted into UV radiation power (total energy radiated per unit time in the form of UV photons) is >10%.

The basic procedures for fabricating light emitting diodes (LEDs) and laser diodes (LDs) in compound semiconductors are well known. Typically, a p-n junction is formed by growing p-type and then n-type (or vice-versa) epitaxial layers on an appropriate substrate. Metal contacts (more desirably, ohmic contacts) are attached to the p-type and n-type semiconductor layers. The LED or LD functions by passing current through the device in the "forward direction." That is, a power source pushes electrons out of the n-type semiconductor toward the p-type semiconductor and holes out of the p-type semiconductor toward the n-type semiconductor. The electrons and holes recombine with each other to produce photons at a wavelength that is determined by the bandgap energy of the semiconductor region where the recombination is occurring and may be shifted to somewhat higher energies by quantum confinement effects as well as by strain and impurities in the recombination region. Many factors can affect the efficiency of the LEDs. However, a very significant factor is the efficiency with which electrons and holes, once either generated or pushed out of their equilibrium positions, recombine to produce the desired radiation. In addition, LDs require the creation of an optical cavity to allow amplification by stimulated emission of the appropriate photons. This efficiency is improved by defining the region of recombination, often by creating one or more quantum wells. However, defects such as dislocations provide non-radiative recombination sites and will also reduce the recombination efficiency. Most importantly, once the density of non-radiative recombination centers gets higher than the typical diffusion length of carriers (the holes and electrons) before they recombine, the loss in efficiency will become very significant and, as the density of defects is increased even further, the device will either perform badly (very inefficient) or not at all.

It is also well known that the addition of In to III-N LED and LD devices helps to localize the free carriers away from non-radiative defects in recombination region probably through the formation of composition fluctuations where regions with higher In content have a somewhat smaller bandgap (and hence, are a lower energy region for the free carriers to localize). This allows visible LEDs (emitting in the wavelength range from 400 to 550 nm) to function even though the dislocation density is very high (exceeding $10^8 \text{ cm}^{-2}$) (see, for example, J. Y. Tsao, Circuits and Devices Magazine, IEEE, 20, 28 (2004)). These high dislocation densities are the result of growing nitride epitaxial layers on foreign substrates such as sapphire (crystalline $Al_2O_3$) or SiC. The wavelength of emission from pure GaN is approximately 380 nm and decreases to 200 nm for pure AlN. Wavelengths in between these two end points are achieved by alloying AlN with GaN. InN can also be introduced to make a $Al_xGa_yIn_{1-x-y}N$ alloy. While success has been achieved in making LEDs at wavelengths down to 250 nm, the efficiencies of these devices remains quite poor (<1%) (A. Khan, "AlGaN based Deep Ultraviolet Light Emitting Diodes with Emission from 250-280 nm," presented at the International Workshop on Nitride Semiconductors in Pittsburg, Pa. (Jul. 19, 2004)).

Furthermore, low substrate dislocation densities appear to be critical to the fabrication of high efficiency ultra-violet (UV) light emitting diodes and UV laser diodes particularly at wavelengths shorter than 340 nm (S. Tomiya, et al., "Dislocations in GaN-Based Laser Diodes on Epitaxial Lateral Overgrown GaN Layers," Phys. Stat. Sol. (a) 188 (1), 69-72 (2001); A. Chitnis et al., "Milliwatt power AlGaN quantum well deep ultraviolet light emitting diodes," Phys. Stat. Sol. (a) 200 (1), 88-101 (2003); M. Takeya, et al., "Degradation in AlGaInN lasers," Phys. Stat. Sol. (c) 0 (7), 2292-95 (2003). Nitride semiconductor layers grown on sapphire substrates typically have dislocation densities of about $10^8$-$10^{10}$ $cm^{-2}$, and recently, S. Tomiya et al. have produced ELO GaN substrates with dislocation densities of about $10^6$ $cm^{-2}$, as discussed in the aforementioned journal article. Furthermore, high efficiency ultraviolet (UV) light emitting diodes and UV laser diodes (LDs) require layers of $Al_xGa_yIn_{1-x-y}N$ with relatively high aluminum concentration.

Higher efficiency, light-emitting diodes (LEDs) have been demonstrated on the AlN substrates prepared by the method of the present invention (R. Gaska, presentation at the Fall Materials Research Society Meeting, Boston, Mass. (2003); and L. J. Schowalter et al., "Native, single-crystal AlN substrates," submitted to Phys. Stat. Sol. (c) Jul. 18, 2004). These results demonstrate over an order of magnitude improvement in photoluminescence efficiency on the low defect layers grown on the substrates cut from bulk crystals of the present invention than those results obtained on high defect density epitaxial layers grown on sapphire (which has a defect density greater than 1,000,000 dislocations $cm^{-2}$). The improved results are believed to be due to the low density of dislocations (10,000 $cm^{-2}$ or less) that are observed in substrates cut and prepared from bulk AlN crystals grown by the present invention. This low dislocation density was measured by Synchrotron White Beam X-ray Topography (SWBXT) (B. Raghothamachar et al., J. Crystal Growth 250, 244-250 (2003); and L. J. Schowalter et al., Phys. Stat. Sol. (c) 1-4 (2003)/DOI 10.1002/pssc.200303462).

Figure 6:
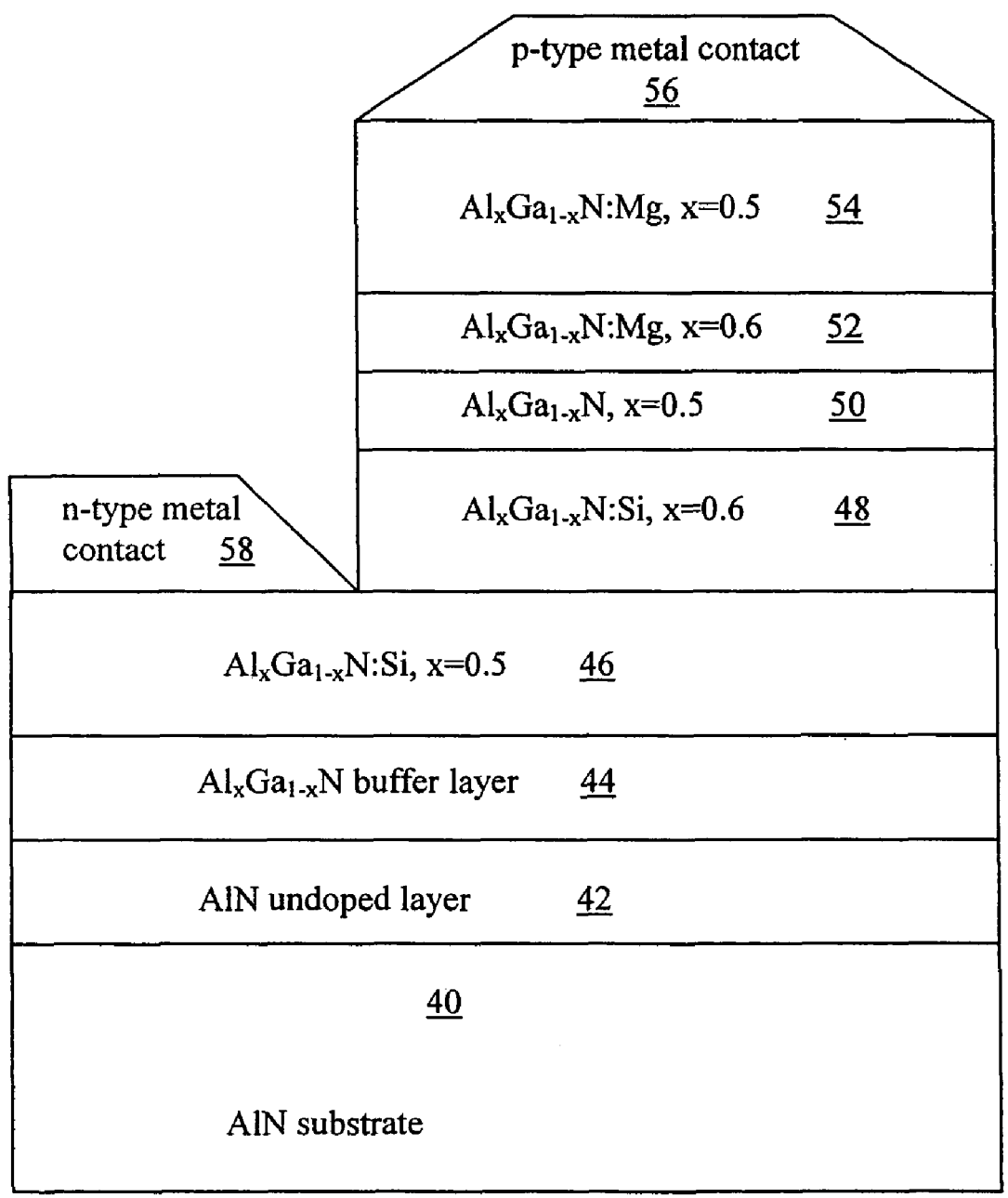
FIG. 6 is a cross-sectional view of a portion of a device fabricated using the method of the present invention.

FIG. 6 and the following example illustrate the fabrication of an exemplary UV laser diode (LD) emitting at a wavelength of 260 nm using conventional techniques. The LD is disposed on a low dislocation density AlN substrate formed by the method of the present invention. The orientation of the AlN substrate in the example is c-face, Al polarity. However, as one of skill would know, other orientations, such as N polarity, m-face, and a-face, could be used instead, depending on the application. Furthermore, as one of skill would also know, many other LD and LED devices emitting at various other wavelengths can alternatively be prepared by the method disclosed herein. In addition, the substitution of multiple quantum wells in the active region as well as patterning the surface to laterally confine the radiation in the quantum wells are well-known procedures to enhance the performance of the laser diode. The example is included to illustrate the fabrication of one such device, and the invention is not limited to the device illustrated in the example.

Example—260 nm Laser Diode Fabrication

FIG. 6 is a schematic cross-sectional view of a portion of a 260 nm laser diode fabricated using the method of the present invention. Initially, low defect density AlN substrate 40, which is prepared using the method discussed above, is polished by chemical mechanical polishing (CMP). Polished substrate 40 is then introduced into a conventional organometallic vapor phase epitaxy system (OMVPE). The surface of the low defect density AlN substrate is cleaned to remove any oxide or other impurities on the crystal surface. Cleaning is effected by heating the substrate at a temperature of 1150° C. for 20 min under ammonia plus nitrogen or hydrogen plus nitrogen flow prior to growth. An epitaxial layer 42 of AlN having a thickness of about 100 nm is then grown on substrate 40 to improve the surface quality of AlN substrate 40 before starting to grow the device layers. Next an undoped $Al_xGa_{1-x}N$ buffer layer 44 having a thickness of approximately 1 μm is grown atop the epitaxial AlN layer 42 to relieve lattice mismatch through the formation of misfit dislocations. Formation of threading dislocations, which will continue to propagate through the device layers, is minimized by grading x from 0 to the final value of 0.5 (50% Al concentration). Onto buffer layer 44, a 1 μm thick layer 46 of Si-doped $Al_xGa_{1-x}N$ (x=0.5) is grown. This layer 46 makes the n-type contact to the LD. A 50 nm thick layer 48 of Si-doped $Al_xGa_{1-x}N$ (x=0.6) is then grown onto the Si-doped $Al_xGa_{1-x}N$ (x=0.5) layer 46, followed by the growth of a 10 nm thick layer 50 of undoped $Al_xGa_{1-x}N$ (x=0.5). Onto layer 50 is grown a 50 nm thick layer 52 of Mg-doped $Al_xGa_{1-x}N$ (x=0.6) followed by the growth of a 1 μm thick layer 54 of Mg-doped $Al_xGa_{1-x}N$ (x=0.5). After the growth steps, substrate 40 (now with epitaxial layers 42, 44, 46, 48, 50, 52 and 54 on it) is slowly ramped down from the growth temperature of about 1100° C. and removed from the OMVPE system. The top surface of epitaxial layer 54 is then coated with a metal contact layer 56 for the p-type semiconductor, and metal layer 56 is coated with a photoresist (not shown), which is then developed. The photoresist is removed where the n-type metal contact 58 will be formed. The substrate plus epitaxial layers plus metal layer are then etched such that the semiconductor is removed down to the n-type layer 46, which will be used for the n-type metal contact 58. A second coating of photoresist (for lift off) (not shown) is deposited, which is then patterned and removed where the n-type contacts are desired. The n-type metallization is complete, and the metal coating adjacent the second photoresist layer is removed by lift off to produce the desired wafer. Laser facets are achieved by cleaving the wafer. These facets may optionally be coated to protect them from damage. Wire bonding contacts (not shown) are made to the p-type and n-type metal layers and the laser diode is packaged appropriately.

The growth of the bulk single crystal of AlN has been described primarily herein as being accomplished by what is commonly referred to as a "sublimation" technique wherein the source vapor is produced at least in part when crystalline solids of AlN or other solids or liquids containing AlN, Al or N sublime preferentially. However, as also disclosed herein, the source vapor may be achieved in whole or in part by the injection of source gases or like techniques that some would refer to as "high temperature chemical vapor deposition". Also, other terms are sometimes used to describe these and other techniques that are used to grow bulk single AlN crystals according to this invention. Therefore, the terms "depositing", "depositing vapor species" and like terms will sometimes be used herein to generally cover those techniques by which the crystal may be grown pursuant to this invention.

Thus, the AlN boules fabricated using the embodiments described hereinabove, may be used to produce a prepared substrate, cutting a wafer or cylinder from the bulk single crystal, preparing a surface on the wafer or cylinder in a known manner to be receptive to an epitaxial layer, and depositing an epitaxial layer on the surface using conventional deposition techniques.

Although the foregoing description relates to AlN crystals and their growth, the skilled artisan will recognize that various aspects of the foregoing description may be used to fabricate other crystalline substrates, such as ZnO, $LiGaO_2$, $MgAl_2O_4$, or Si, without departing from the spirit and scope of the present invention.

For example, the present method may be used to produce single crystals of ZnO. In this embodiment, Zn and $O_2$ vapor are introduced into a crystal growth enclosure, as previously described with respect to Al and $N_2$. The $O_2$ partial pressure in the crystal growth enclosure is held at greater than stoichiometric pressure relative to the Zn partial pressure. In addition, one or more nucleation sites are contained in the crystal growth enclosure, and the nucleation site(s) are cooled relative to other locations in the crystal growth enclosure. The Zn and $O_2$ vapor is deposited under conditions capable of growing single crystalline ZnO originating at the nucleation site, as described herein with respect to AlN. Optionally, the cooling step may be effected by placing the crystal growth enclosure within a temperature gradient, and the crystal growth enclosure may then be moved through the temperature gradient while depositing the vapor, as discussed above.

The skilled artisan will also recognize that while various embodiments of the present invention have been described herein as utilizing a seed crystal to promote crystal growth, the teachings herein may also be used for unseeded crystal growth, without departing from the scope and spirit of the present invention.

The modifications to the various aspects of the present invention described hereinabove are merely exemplary. It is understood that other modifications to the illustrative embodiments will readily occur to persons with ordinary skill in the art. All such modifications and variations are deemed to be within the scope and spirit of the present invention as defined by the accompanying claims.

All of the patents, patent applications, journal articles, and other references mentioned above are incorporated herein by reference.

What is claimed is:

1. A method of producing single-crystal AlN, the method comprising:
    (a) providing in a crystal growth enclosure a mixture comprising Al and $N_2$ vapor;
    (b) maintaining, in the crystal growth enclosure, a partial pressure of $N_2$ greater than a stoichiometric pressure relative to the Al; and
    (c) depositing the vapor as single-crystalline AlN,
    further comprising maintaining the total vapor pressure in the crystal growth enclosure at super-atmospheric pressure.

2. A system for producing bulk single crystals of AlN, the system comprising:
    a crystal-growth enclosure for containing Al and $N_2$ vapor; and
    a pressurization system configured to maintain, in the crystal growth enclosure, a partial pressure of $N_2$ greater than a stoichiometric pressure relative to the Al, whereby the vapor is deposited as single-crystalline AlN,
    wherein the pressurization system is further configured to maintain a total vapor pressure at super-atmospheric pressure.

3. A system for producing bulk single crystals of AlN, the system comprising:
    a crystal-growth enclosure for containing Al and $N_2$ vapor; and
    a pressurization system configured to maintain, in the crystal growth enclosure, a partial pressure of $N_2$ greater than a stoichiometric pressure relative to the Al, whereby the vapor is deposited as single-crystalline AlN,
    wherein the crystal-growth enclosure comprises a selective barrier configured to permit migration of $N_2$ therethrough, but to substantially prevent migration of Al therethrough.

4. The system of claim 3, wherein the selective barrier comprises a tungsten wall.

5. The system of claim 3, wherein the selective barrier comprises an opening within the crystal-growth chamber sized and shaped to permit diffusion therethrough of $N_2$, while substantially preventing diffusion therethrough of Al.

6. The system of claim 3, wherein the selective barrier comprises a seal configured to substantially prevent passage of vapor therethrough when vapor pressures interior and exterior to the crystal growth chamber are at mechanical equilibrium, and to permit passage of vapor therethrough when the vapor pressures are not at mechanical equilibrium.

* * * * *